(12) United States Patent
Basler et al.

(10) Patent No.: US 10,333,387 B2
(45) Date of Patent: Jun. 25, 2019

(54) ELECTRIC ASSEMBLY INCLUDING A SEMICONDUCTOR SWITCHING DEVICE AND A CLAMPING DIODE

(71) Applicant: Infineon Technologies AG, Neubiberg (DE)

(72) Inventors: Thomas Basler, Riemerling (DE); Roman Baburske, Otterfing (DE); Johannes Georg Laven, Taufkirchen (DE)

(73) Assignee: Infineon Techonologies AG, Neubiberg (DE)

( * ) Notice: Subject to any disclaimer, the term of this patent is extended or adjusted under 35 U.S.C. 154(b) by 417 days.

(21) Appl. No.: 15/331,548

(22) Filed: Oct. 21, 2016

(65) Prior Publication Data

US 2017/0117798 A1  Apr. 27, 2017

(30) Foreign Application Priority Data

Oct. 23, 2015 (DE) .......................... 10 2015 118 165

(51) Int. Cl.
*H02H 9/00* (2006.01)
*H02M 1/32* (2007.01)
(Continued)

(52) U.S. Cl.
CPC .............. *H02M 1/32* (2013.01); *H01L 23/60* (2013.01); *H01L 25/18* (2013.01); *H01L 29/0611* (2013.01); *H01L 29/16* (2013.01); *H01L 29/1608* (2013.01); *H01L 29/7393* (2013.01); *H01L 29/861* (2013.01); *H01L 29/868* (2013.01); *H01L 29/872* (2013.01);
(Continued)

(58) Field of Classification Search
None
See application file for complete search history.

(56) References Cited

U.S. PATENT DOCUMENTS 5,663,671 A * 9/1997 Steglich .................. H03F 3/087
327/323
6,278,314 B1 8/2001 Asplund et al.
(Continued)

FOREIGN PATENT DOCUMENTS

JP  H06-326579 A  11/1994
JP  H10116999 A  5/1998
(Continued)

OTHER PUBLICATIONS

Baburske, Roman et al., "A new Diode Structure with Inverse Injection Dependency of Emitter Efficiency (IDEE)", Proceedings of the 22nd International Symposium on Power Semiconductor Devices & ICs, Hiroshima, pp. 165-168.

*Primary Examiner* — Stephen W Jackson
(74) *Attorney, Agent, or Firm* — Murphy, Bilak & Homiller, PLLC

(57) ABSTRACT

An electric assembly includes a semiconductor switching device with a maximum breakdown voltage rating across two load terminals in an off-state. A clamping diode is electrically connected to the two load terminals and parallel to the switching device. A semiconductor body of the clamping diode is made of silicon carbide. An avalanche voltage of the clamping diode is lower than the maximum breakdown voltage rating of the switching device.

26 Claims, 19 Drawing Sheets

(51) Int. Cl.
*H01L 23/60* (2006.01)
*H01L 25/18* (2006.01)
*H01L 29/06* (2006.01)
*H01L 29/16* (2006.01)
*H01L 29/739* (2006.01)
*H01L 29/868* (2006.01)
*H01L 29/872* (2006.01)
*H01L 29/861* (2006.01)
*H03K 17/0814* (2006.01)
*H03K 17/12* (2006.01)
*H03K 17/74* (2006.01)

(52) U.S. Cl.
CPC ... *H01L 29/8725* (2013.01); *H03K 17/08148* (2013.01); *H03K 17/127* (2013.01); *H01L 29/0619* (2013.01); *H01L 29/0623* (2013.01); *H01L 29/0649* (2013.01); *H01L 29/0692* (2013.01); *H03K 17/12* (2013.01); *H03K 17/74* (2013.01)

(56) References Cited

U.S. PATENT DOCUMENTS

| 7,880,174 | B2 | 2/2011 | Shimizu et al. |
| 8,362,590 | B2* | 1/2013 | Kanschat ............ H01L 29/0619 257/48 |
| 8,411,474 | B2* | 4/2013 | Roesner ................ H02M 7/487 363/56.01 |
| 8,912,621 | B1 | 12/2014 | Chuang et al. |
| 2008/0258252 | A1 | 10/2008 | Shimizu et al. |

FOREIGN PATENT DOCUMENTS

| JP | 2000116114 A | 4/2000 |
| JP | 2000252456 A | 9/2000 |
| JP | 2001245466 A | 9/2001 |
| JP | 2003318412 A | 11/2003 |
| JP | 2008072848 A | 3/2008 |
| JP | 2008271207 A | 11/2008 |
| JP | 2010539719 A | 12/2010 |
| JP | 2013089723 A | 5/2013 |
| JP | 2013229956 A | 11/2013 |
| JP | 2015035627 A | 2/2015 |

* cited by examiner

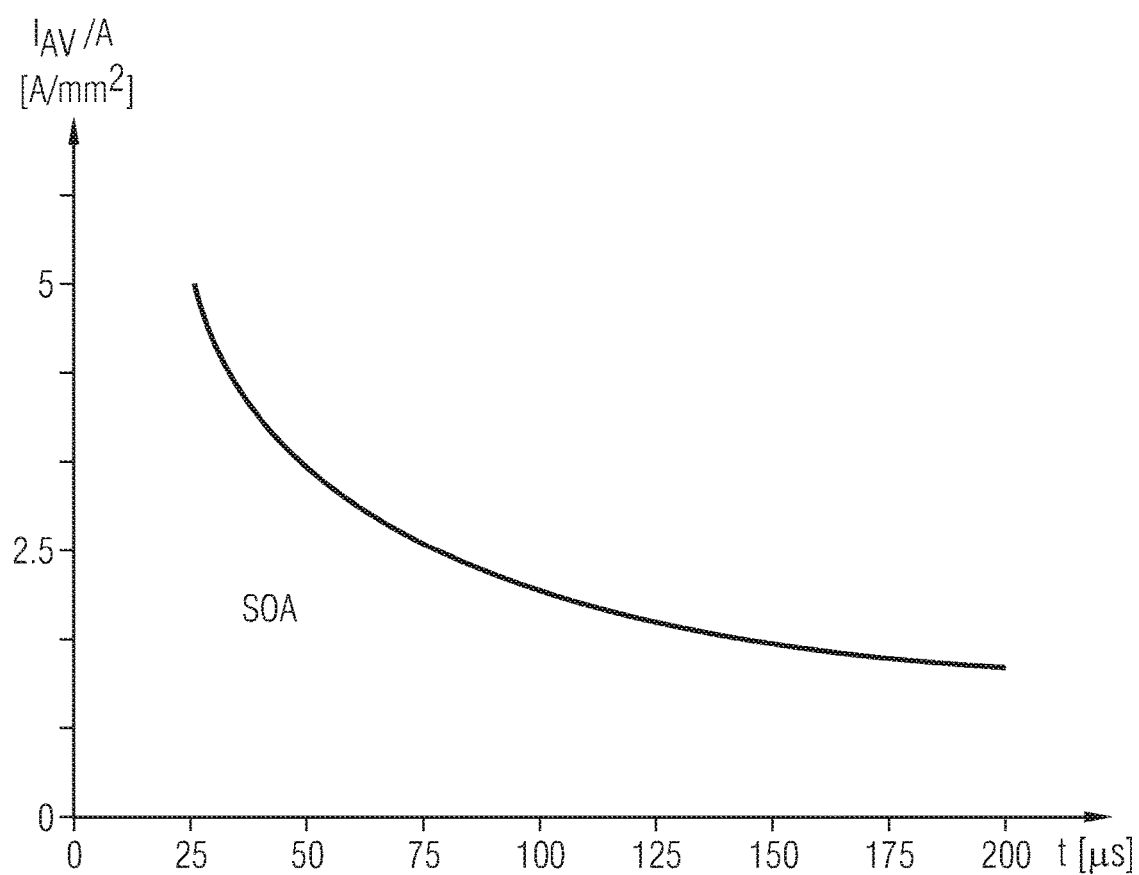

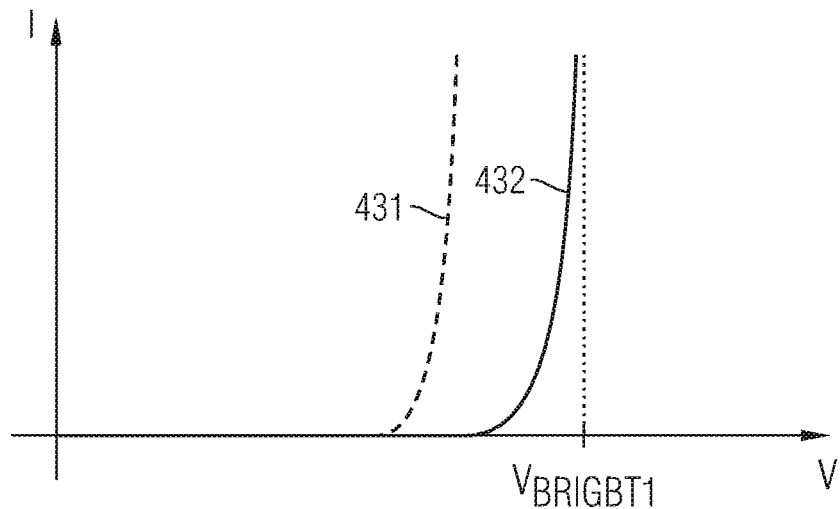
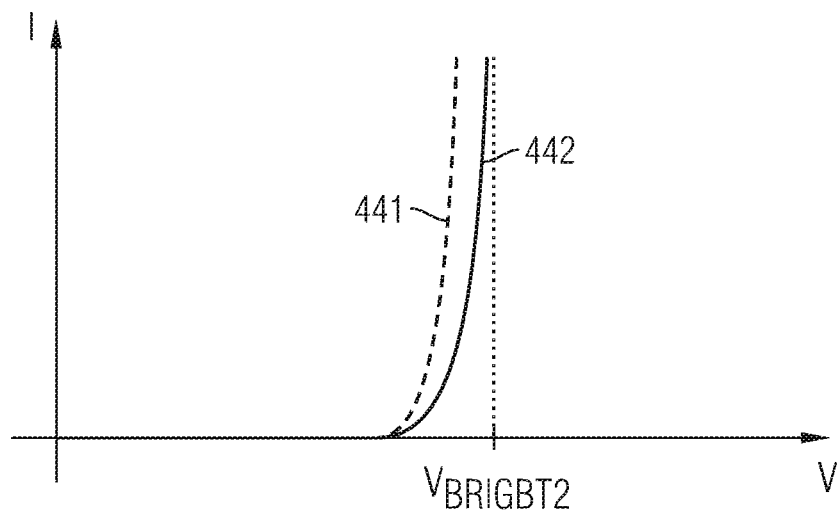

ELECTRIC ASSEMBLY INCLUDING A SEMICONDUCTOR SWITCHING DEVICE AND A CLAMPING DIODE

BACKGROUND

In applications such as motor drives and power conversion circuits, semiconductor switches repeatedly turn on and off a load current through an inductive load such as transformer coils or motor windings. Typically, free-wheeling diodes are electrically connected in parallel to the inductive load or parallel to the semiconductor switch. After shutting-down the load current, the free-wheeling diode gets forward-biased and allows the inductive load to dissipate the energy stored in its magnetic field.

In half-bridge circuits, e.g., in H-bridges for motor drives or at the primary side of half-bridge converters a free-wheeling diode that gets forward-biased when the high-side switch turns off is typically connected in parallel to and combined with the low-side switch and a free-wheeling diode that gets forward-biased when the low-side switch turns off is typically connected in parallel to and combined with the high-side switch. Device parameters such as blocking capability of the free-wheeling diode and blocking capability of the semiconductor switch typically match, wherein device parameters such as blocking voltage, on-state resistance, and switching losses are in relationship to each other in a way such that, e.g., higher blocking capability means higher on-state resistance and/or higher switching losses in the semiconductor switches.

It is desirable to provide electric assemblies that include semiconductor switches and that combine low switching losses with high reliability.

SUMMARY

According to an embodiment an electric assembly includes a semiconductor switching device that withstands a maximum breakdown voltage rating across two load terminals in an off-state. A clamping diode is electrically connected to the two load terminals and parallel to the switching device. A semiconductor body of the clamping diode is of silicon carbide. An avalanche voltage of the clamping diode is lower than the maximum breakdown voltage rating of the switching device.

According to another embodiment, an electronic assembly includes a low-side switch with a first electric assembly and a high-side switch with a second electric assembly. The low-side switch and the high-side switch are electrically arranged in a half-bridge configuration. At least one of the electric assemblies includes a semiconductor switching device that withstands a maximum breakdown voltage rating across two load terminals in an off-state. A clamping diode is electrically connected to the two load terminals and parallel to the switching device. A semiconductor body of the clamping diode is of silicon carbide. An avalanche voltage of the clamping diode is lower than the maximum breakdown voltage rating of the switching device.

According to another embodiment, an insulated gate bipolar transistor module includes a half-bridge circuit including a low-side switch and a high-side switch. The low-side switch includes a first electric assembly and the high-side switch includes a second electric assembly. At least one of the first and second electric assemblies includes a semiconductor switching device that withstands a maximum breakdown voltage rating across two load terminals in an off-state. A clamping diode is electrically connected to the two load terminals and parallel to the switching device. A semiconductor body of the clamping diode is of silicon carbide. An avalanche voltage of the clamping diode is lower than the maximum breakdown voltage rating of the switching device.

According to a further embodiment an electric assembly includes a semiconductor switching device that withstands a maximum breakdown voltage rating across two load terminals in an off-state. A clamping diode is electrically connected to the two load terminals and parallel to the switching device. An avalanche voltage of the clamping diode is lower than the maximum breakdown voltage rating of the switching device. A feedback circuit electrically connects an anode electrode of the clamping diode with a gate electrode of the switching device. The feedback circuit increases or decreases a gate voltage at the gate electrode with increasing current through the reverse-biased clamping diode.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1D is a schematic diagram illustrating a safe operating area as regards single avalanche events in the clamping diode of FIG. 1A according to an embodiment.

FIG. 4C is a schematic diagram showing voltage/current characteristics of a silicon clamping diode for different temperatures to discuss effects of the embodiments.

FIG. 4D is a schematic diagram showing voltage/current characteristics of a SiC clamping diode for different temperatures to discuss effects of the embodiments.

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

FIGS. 1A to 1D refer to an electric assembly 500 that may be part of a single-ended switching circuit or a half-bridge circuit, by way of example, wherein the half-bridge circuit may be part of a H-bridge, a motor controller or a power converter, e.g., a DC/AC power converter, an AC/AC converter or a DC/DC converter. The electric assembly 500 may form or may be part of a high-side switch or may form or may be part of a low-side switch of the half-bridge circuit.

Figure 1A:
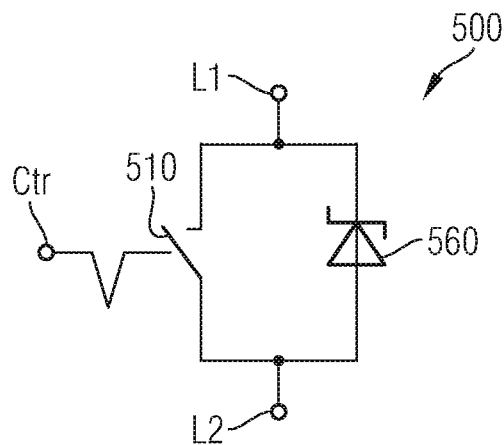
FIG. 1A is a schematic circuit diagram of an electric assembly according to an embodiment including a semiconductor switching device and a clamping diode with an avalanche voltage which is lower than a maximum breakdown voltage rating of the switching device.

FIG. 1A shows a semiconductor switching device 510 that switches a load current between a first load terminal L1 and a second load terminal L2 in response to a signal applied to a control terminal Ctr. The switching device 510 may be an IGFET, for example an MOSFET (metal-oxide semiconductor field effect transistor) in the usual meaning including metal gates and semiconductor gates or an IGBT. One of the first and second load terminals L1, L2, for example the first load terminal L1 is at the supply side and may be electrically coupled to a power supply. The other one of the first and second load terminals L1, L2, for example the second load terminal L2 is at the load side and may be electrically coupled to a load supplied by the power supply.

In an off-state the switching device 510 blocks a positive voltage applied across the first and second load terminals L1, L2. When, starting from an off-state level, a signal applied to the control terminal Ctr rises above or falls below a threshold voltage, the switching device 510 turns on and opens a low-resistive path between the first and second load terminals L1, 12 for a load current through the switching device 510 and the load. When the signal applied to the control terminal CTR returns to the off-state level, the switching device 510 turns off.

Any inductance in a load circuit supplied by the load current through the turned-on switching device 510 may generate an additional voltage drop. The effect of the inductance of the load, which may be a motor winding or a transformer winding, may be dissipated through further devices such as free-wheeling diodes. The effect of parasitic inductances within the commutation circuit, e.g., the inductance of conductive paths within the electric assembly 500 or the inductance of wiring connections to the electric assembly 500, is typically not dissipated by external circuit elements. Overvoltage resulting from parasitic inductances at the supply side may result in that the potential at the first load terminal L1 can exceed the positive supply voltage. In addition or alternatively, parasitic inductances at the switched side may result in that the potential at the second load terminal L2 can fall below the negative supply voltage. Surge events and grid overvoltage may superimpose to the supply voltage and may be an alternative or additional source for overvoltage across the first and second load terminals L1, L2.

If the resulting overvoltage results in that the switching device 510 begins to break down and a resulting breakdown current through the switching device has a sufficiently high current rising rate di/dt or in general a too high current is driven on the breakdown branch, the overvoltage may trigger a destructive mechanism in the switching device 510, for example a destructive avalanche. For example, IGBTs designed for low ohmic and low switching losses may be sensitive to overvoltage, because designing for low losses typically does not match constraints for overvoltage ruggedness.

A clamping diode 560 with a semiconductor body based on silicon carbide and an avalanche voltage that is lower than a maximum breakdown voltage rating of the switching device 510 reliably protects the switching device 510 from destructive overvoltage conditions. For example, the avalanche voltage of the clamping diode 560 is at least 10%, e.g., at least 20% lower than a maximum breakdown voltage rating of the switching device 510 within the complete nominal temperature range of the switching device 510.

If the clamping diode 560 can sustain, on its breakdown branch, at least 500% or 400% of a maximum long-term load current rating of the switching device 510 for at least 1 μs, 100 ns or 10 ns, the clamping diode 560 is safe from being destroyed when the switching device 510 is turned off after detection of a short-circuit condition.

If the clamping diode 560 can sustain, on its breakdown branch, at least 200% or 100% of a maximum long-term load current rating of the switching device 510 for at least 10 ns, 500 ns, 1 μs or 5 μs seconds, the clamping diode 560 is safe from being destroyed by occasional overvoltage conditions occurring at a repetition rate lower than 0.1 Hz in applications such as flyback converters.

If the clamping diode 560 can sustain, on its breakdown branch, at least 200%, 150% or 100% of a maximum long-term load current rating of the switching device 510 at a repetition rate up to 16 kHz for a total overload period of at least 20 s, 1 s, or 100 ms, the clamping diode 560 is safe from being destroyed by repetitive overvoltage conditions occurring under overload conditions in servo motors with switching frequencies typically up to 16 kHz and overload periods of up to 20 s.

Another definition of the avalanche ruggedness may be defined in view of applications in half-bridge circuits and a periodic load current flowing through an inductive load electrically connected to a network node between a high-side switch and a low side switch.

Figure 1B:
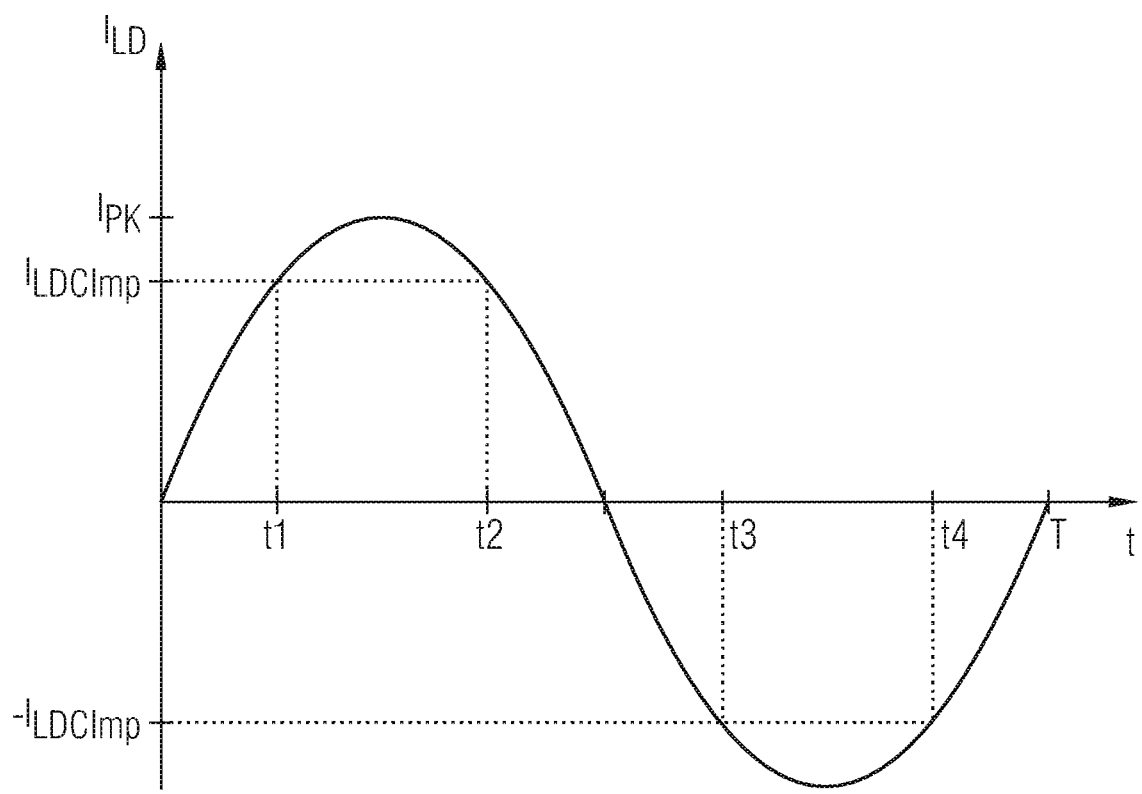
FIG. 1B is a schematic diagram illustrating a periodic load current for illustrating a definition of avalanche ruggedness for the clamping diode of FIG. 1A.

FIG. 1B shows the periodic load current ILD with a period T and a peak current IPK. The clamping may be active when the load current ILD exceeds 50%, 80% or 90% of the peak current. If for the time of clamping, the clamping diode 560 can sustain, on its breakdown branch, at least 150%, 120% or 100% of a maximum long-term load current rating of the switching device 510 for repetitive pulses of a duration of at least 10 ns, 100 ns or 1 μs, the clamping diode 560 is safe from being destroyed by successive overvoltage conditions occurring around peaks of a periodic load signal at a repetition rate typical for switching frequencies up to 10 kHz, 20 kHz, or 50 kHz.

Due to the material characteristics of silicon carbide, the clamping diode 560 withstands comparatively high breakdown currents up to e.g. 5000 A/cm$^2$ or more without losing blocking capability directly after the avalanche breakdown has ceased.

Other than clamping diodes based on silicon, for example Si-TVS (silicon transient voltage suppressor) diodes, one single clamping diode can withstand a blocking voltage of more than 650 V, 1200V, 1700V or more. In SiC diodes the breakdown voltage depends to a lower degree on the temperature than in silicon diodes. As a result the voltage across the load terminals L1, L2 remains more stable. The steep I/V characteristic of SiC diodes results in that after the breakdown the voltage increases only to a low degree.

SiC diodes typically have a higher background doping such that when the semiconductor body is flooded with charge carriers in the avalanche breakdown, the distribution of the charge carriers and current density is more uniform than in silicon. Local overheating can be avoided to a higher degree such that avalanche ruggedness is higher.

The electric assembly 500 may be part of a single-sided switch, wherein a free-wheeling diode for dissipating energy stored in a magnetic field of an inductive load is typically connected in parallel to the semiconductor switching device 510. The clamping diode 560 may be effective as the free-wheeling diode or another diode primarily used as free-wheeling diode may be electrically connected in parallel to the clamping diode 560.

According to other embodiments the electric assembly 500 is part of a half-bridge circuit. In half-bridge circuits, a high-side switch and a low-side switch are electrically connected in series with regard to their load paths. A load is connected to an intermediate network node connecting the high-side switch and the low-side switch. A gate driver circuit alternatively turns on and off the high-side switch and the low-side switch.

If the switching devices of the half-bridge circuit are IGFETs, typically a body diode of the high-side switch allows a current to flow that dissipates energy stored in the inductances at the switched load side after the low-side switch has turned off. A body diode of the low-side switch allows a current to flow that dissipates energy stored in the inductances at the switched load side after the high-side switch has turned off.

If the switching devices of half-bridge circuit are IGBTs, after the low-side switch has turned off, a freewheeling diode electrically connected in parallel to the high-side switch allows a current to flow that dissipates energy stored in the inductances at the switched load side. After the high-side switch has turned off a freewheeling diode electrically connected in parallel to the low-side switch allows a current to flow that dissipates energy stored in the inductances at the switched load side.

In both cases, the body diodes and the free-wheeling diodes operate in the forward mode. Since the body diodes and the free-wheeling diodes are typically not avalanche-rugged, the blocking capability of the body diodes and the free-wheeling diodes is typically the same or higher as the blocking capability of the semiconductor switch they are assigned to. By contrast, the clamping diode 560 according to the embodiments responds to a reverse overvoltage condition. The clamping diode 560 protects the switching device 510 from being subjected to any voltage beyond the maximum breakdown voltage rating. Since the clamping diode 560 can sustain at least 80% of a maximum long-term load current rating of the switching device 510 for at least 500 ns, 1 µs or 5 µs, the clamping diode 560 is safe from being destructed by repetitive overvoltage conditions occurring in switching cycles with a repetition rate of at most 50 kHz.

Compared to conventional approaches that avoid destructive overvoltage conditions by selecting switching devices with a maximum voltage blocking rating far beyond the highest supply voltage, i.e., by considering a high safety margin as regards the breakdown voltage at the cost of power efficiency, the clamping diode 560 allows the use of switching devices 510 with lower electric losses.

For example, for an application that supplies voltages of at most 600 V, a conventional half-bridge circuit typically may include switching devices with a maximum breakdown voltage rating of 1200 V, wherein 1200 V devices typically have significantly higher losses than 600 V devices. Due to the high overvoltage ruggedness of the electric assembly 500, a 900 V switching device with inherently lower losses may replace the 1200 V switching device without loss of reliability.

Due to the breakdown-rugged clamping diode 560 the electric assembly 500 is less sensitive to parasitic inductances. A wiring between components of the electric assembly 500 as well as a wiring of an electric module including the electric assembly 500 may get along without expensive low-inductance wiring connections. Design requirements for the wiring on/to component carriers such as, e.g., a PCB (printed circuit board) are more relaxed.

Figure 1C:
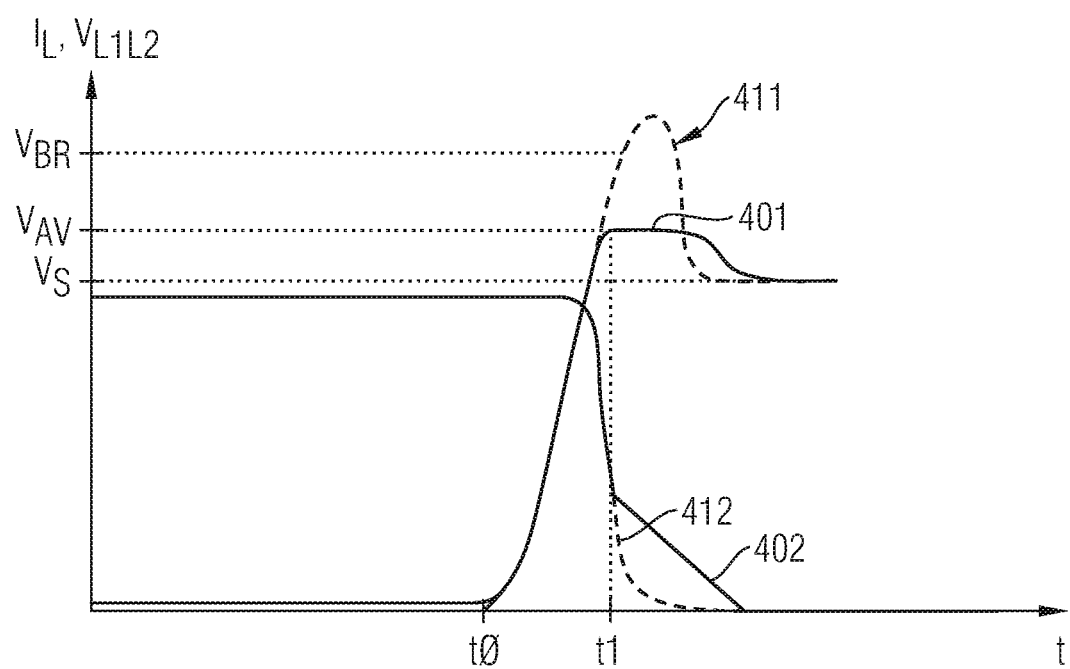
FIG. 1C is a schematic diagram illustrating a mode of operation of the electric assembly of FIG. 1A.

In FIG. 1C a reference voltage curve 411 as well as a reference current curve 412 illustrate the switching behavior of the switching device 510 of FIG. 1A without the clamping diode 560. After starting the turn-off, the voltage $V_{L1L2}$ between the first and the second load terminals L1, L2 steeply rises at t=t0. After some time, at $V_{L1L2}=V_S(V_{DC})$, the load current $I_L$ begins to steeply fall. Energy stored in the magnetic fields of parasitic inductances at the switched load side or between the voltage source supplying the supply voltage $V_S$ and the load terminal at the supply side induces a dissipation current increasing the potential at the supply side and/or lowering the potential at the switched load side of the switching device 510 to below the lower potential of the supply voltage $V_S$. A significant overvoltage condition may occur. In half-bridge configurations, a turn-on overvoltage of a free-wheeling diode of the complementary switching circuit may superimpose to the potential at the switched side. The voltage $V_{L1L2}$ may exceed the maximum breakdown voltage rate $V_{BR}$ of the switching device 510 of FIG. 1A.

A voltage curve 401 as well as a current curve 402 illustrate the switching behavior of the electric assembly 500 of FIG. 1A with the clamping diode 560. After start of turn-off at t=t0, the voltage $V_{L1L2}$ steeply rises. When at t=t1 the voltage across the electric assembly 500 exceeds the avalanche voltage $V_{AV}$ of the clamping diode 560, the latter starts to conduct. The voltage across the switching device 510 does not exceed the avalanche voltage $V_{AV}$, which is higher than the supply voltage $V_S$ and lower than the maximum breakdown voltage rating $V_{BR}$ of the switching device 510.

The clamping diode 560 is an avalanche diode designed to safely handle the avalanche phenomenon without getting destroyed. In an avalanche diode the avalanche breakdown takes place in a central region, whereas in other diodes the avalanche breakdown typically takes places in a termination region between the central region and an outer lateral surface of a semiconductor body. Avalanche diodes typically specify a maximum repetitive areal Avalanche energy $E_{AR}/A$ of at least 0.5 J/cm² or at least 2 J/cm² for pulses of 2 µs or at least 10 J/cm² for pulses of 20 µs at a duty cycle of the pulses of 0.1%. By contrast, in Schottky diodes, the maximum electric field strength is close to the metal-semiconductor interface and such that Schottky diodes are typically no suitable Avalanche diodes.

FIG. 1D shows the safe operating area of the clamping diode 560 of FIG. 1A for occasional avalanche events according to an embodiment. For example, for a SiC clamping diode with a die size of 5 mm², the clamping diode 560 can be in the avalanche breakdown for 20 µs without being irreversibly damaged, subject to that the avalanche current $I_{AV}$ does not exceed 25 A.

Figure 2:
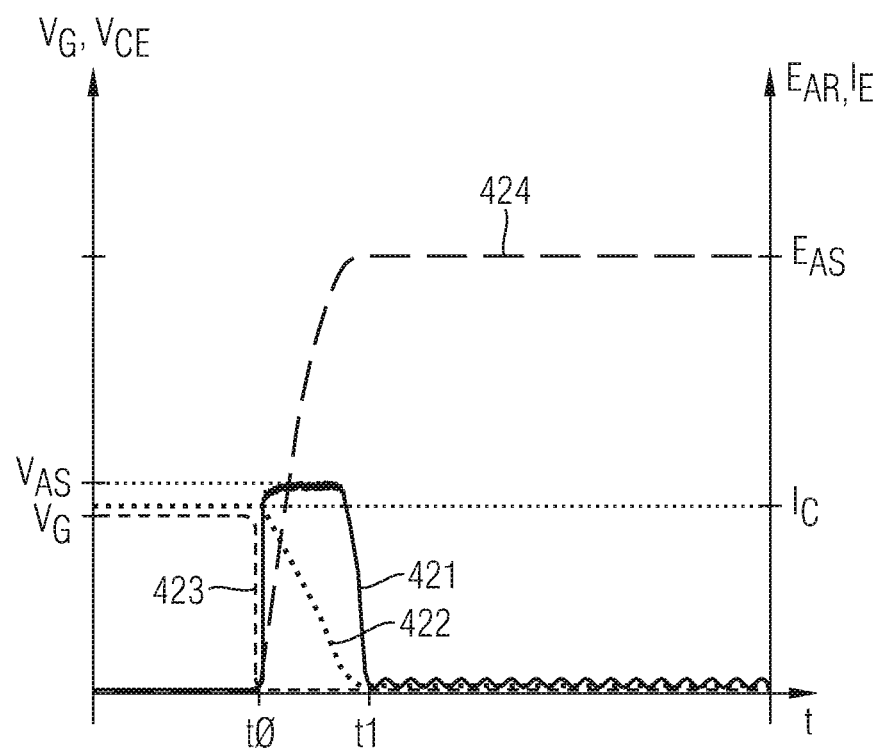
FIG. 2 is a schematic diagram showing voltage and current curves of an electric assembly according to an embodiment including a Si-IGBT (silicon insulated gate bipolar transistor) and a SiC-MBS (silicon carbide merged pin Schottky) diode.

FIG. 2 refers to an electronic assembly according to an embodiment including a 1200V SiC-MPS diode as clamping diode with an avalanche voltage $V_{AV}$=1200 V electrically connected in parallel to a 1700V Si-IGBT with a maximum breakdown voltage rating $V_{BR}$=1700V as switching device.

At t=t0, $V_G$ voltage curve 423 for the gate voltage $V_G$ falls from above a threshold level to below the threshold level and turns off the 1700V Si-IGBT. A $V_{CE}$ voltage curve 421 for the collector-to-emitter voltage $V_{CE}$ across the first and second load terminals L1, l2 steeply rises. At $V_{CE}=V_{AS}$ the 1200V Si-MPS diode breaks down such that $V_{CE}$ does not exceed about 1600 V. The 1700V Si-IGBT is save from any overvoltage condition.

$I_L$ current curve 422 for a load current $I_L$ through the electronic assembly shows a less steep fall for the time the clamping diode is in the avalanche state. $E_{AR}$ curve 424 for the dissipated avalanche energy $E_{AR}$ rises to a maximum value $E_{AS}$ of about 150 mJ during one avalanche cycle. The dissipated avalanche energy $E_{AS}$ heats up the 1200V SiC-MPS diode and results in a perceivable modification of $V_{CE}$, wherein the modification is significantly lower than for silicon diodes.

Intrinsic change carrier density in silicon carbide is low even at comparatively high temperatures up to about 1000° C. As a result, the leakage current of a blocking SiC-MPS diode or any other silicon carbide diode is low even directly after recovering from an avalanche breakdown, whereas silicon diodes, e.g., silicon TVS (transient voltage suppressors) show a significant leakage current directly after recovering from the avalanche breakdown.

The switching device 510 of FIG. 1A may be a single semiconductor switch or may include a plurality of semiconductor switches electrically connected in parallel to each other. The electric assembly 500 may include further components, for example conventional Si-FWDs for dissipating energy temporarily stored in inductive loads and/or Schottky diodes for achieving a better trade-off between noise and recovery current.

Figure 3A:
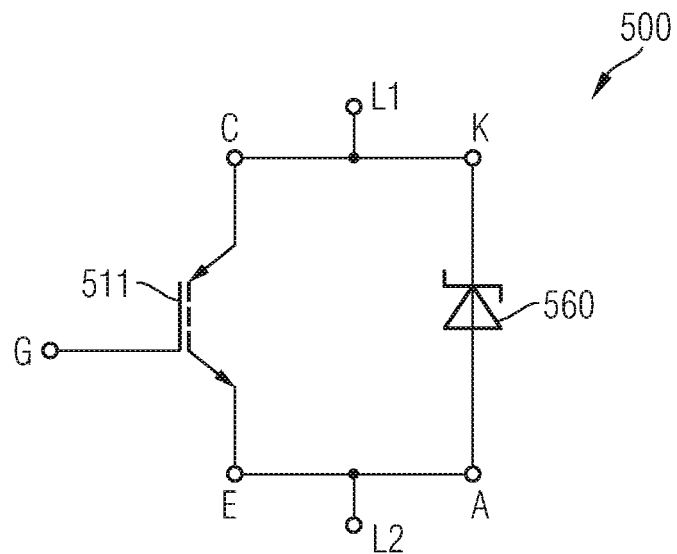
FIG. 3A is a schematic circuit diagram of an electric assembly according to an embodiment including a Si-IGBT and a SiC clamping diode.

In FIG. 3A, an electric assembly 500 includes an Si-IGBT 511 with a collector electrode C electrically connected to the first load terminal L1 and an emitter electrode E electrically connected to the second load terminal L2. A signal applied to a gate terminal G turns on and off the Si-IGBT 511. A cathode electrode K of the clamping diode 560 is directly electrically connected to the first load electrode L1, to the collector electrode C or to both. An anode electrode A of the clamping diode 560 is directly electrically connected to the second load terminal L2, to the emitter electrode E or to both. The clamping diode 560 is an avalanche diode with a semiconductor body based on SiC and an avalanche voltage below the maximum breakdown voltage rating of the Si-IGBT 511.

Figure 3B:
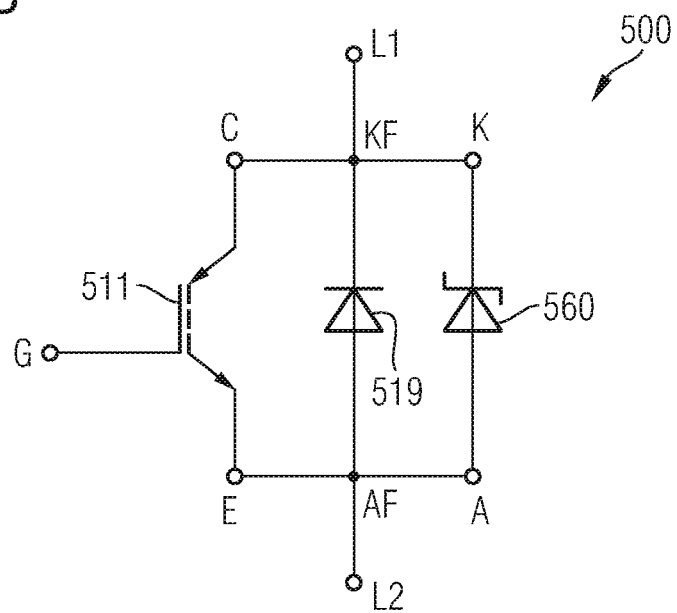
FIG. 3B is a schematic circuit diagram of an electric assembly according to an embodiment including an Si-IGBT, an Si-FWD (silicon free-wheeling diode) and an SiC clamping diode.

In FIG. 3B, the electric assembly 500 further includes a free-wheeling diode 519. The free-wheeling diode 519 may be a silicon diode with a breakdown voltage greater than the avalanche voltage of the clamping diode 560. The free-wheeling diode 519 may be part of a commutation circuit that may include a further semiconductor switch electrically arranged in series with the electric assembly 500.

A cathode electrode KF of the free-wheeling diode 519 is directly electrically connected to at least one of the cathode electrode C, the cathode electrode K of the clamping diode 560 and the first load terminal L1. An anode terminal AF of the free-wheeling diode 519 is directly electrically connected to at least one of the emitter electrode E, the anode electrode A of the clamping diode 560 or the second load terminal L2.

When the Si-IGBT 511 is in an off-state, the free-wheeling diode 519 may operate in a forward mode when an inductive load reverses the polarity of the voltage across the first and second load terminals L1, L2 with respect to the polarity of the voltage across the first and second load terminals L1, 12 when the Si-IGBT 511 is in the on-state.

When the free-wheeling diode 519 is conductive, a commutation current may be split between the free-wheeling diode 519 and the clamping diode 560.

The free-wheeling diode 519 may be selected to achieve a low forward voltage such that the electric assembly shows both low ohmic losses during commutation and a steep clamping behavior defined by the characteristics of the SiC clamping diode 560.

In addition, typically the free-wheeling diode 519 periodically conducts and the forward current heats up the free-wheeling diode 519. Instead, the clamping diode 560 typically breaks down only exceptionally. Hence the clamping diode 560 may be provided with smaller active area for sustaining the same avalanche current.

A bipolar current through the clamping diode 560 generates a dense charge carrier plasma in which significant recombination takes place. In SiC the energy set free during recombination may locally damage the crystal lattice such that bipolar current steadily degrades the SiC clamping diode. In combination with the free-wheeling diode 519, the SiC clamping diode 560 can be selected such that a bipolar current through the SiC clamping diode 560 can be avoided.

Figure 3C:
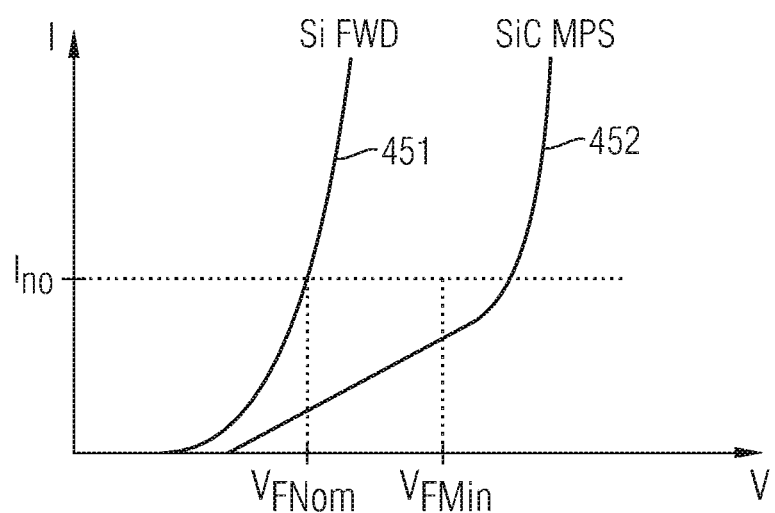
FIG. 3C is a schematic diagram showing voltage/current characteristics of an SiC clamping diode and a free-wheeling diode for discussing effects of the embodiment of FIG. 3B.
Figure 5A:
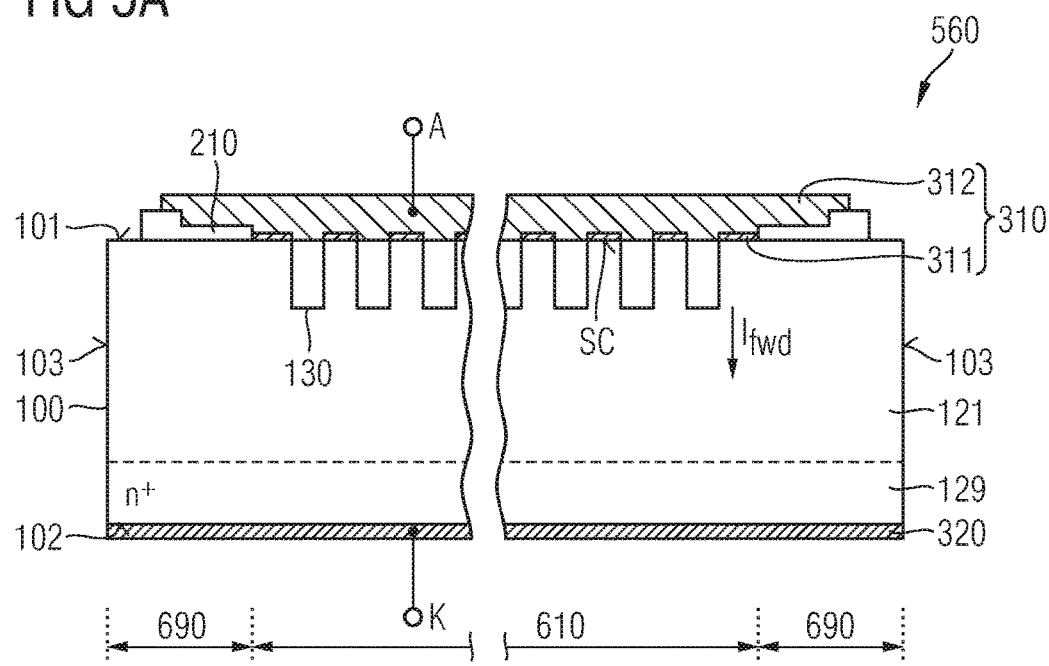
FIG. 5A is a schematic vertical cross-sectional view of a SiC clamping diode in which an avalanche breakdown takes place in an active area according to an embodiment.

FIG. 3C shows the forward characteristic 451 of the free-wheeling diode 519 and the forward characteristic 452 of the SiC clamping diode 560 of FIG. 5A according to an embodiment with the nominal forward current of the free-wheeling diode 519 selected such that the resulting forward voltage VFnom is lower than a minimum voltage VFmin at which the SiC clamping diode changes from the unipolar conducting mode in which only one type of charge carriers flows, to a bipolar conducting mode, in which both types of charge carriers flow. Preventing the SiC clamping diode 560 from changing into the bipolar conducting mode at the same time avoids degradation of the SiC clamping diode 560.

Figure 3D:
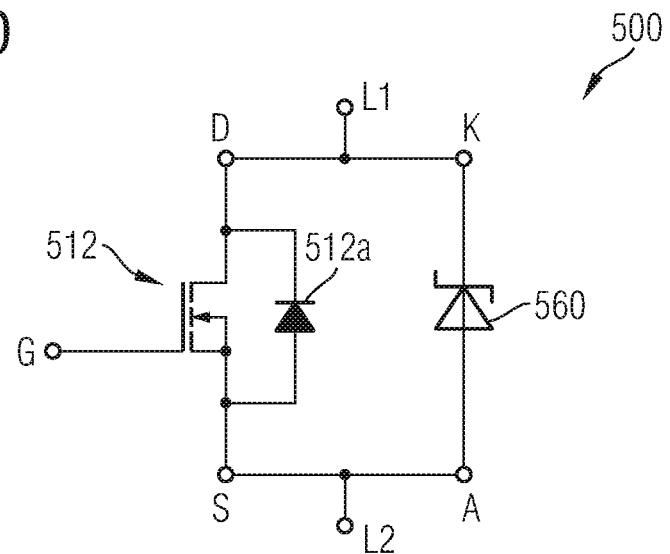
FIG. 3D is a schematic circuit diagram of an electric assembly according to an embodiment, including an SiC clamping diode and a Si-IGFET (silicon insulated gate field effect transistor) with body diode.

In FIG. 3D, the switching device 510 is an IGFET 512 whose internal body diode 512a may be effective as free-wheeling diode.

Figure 3E:
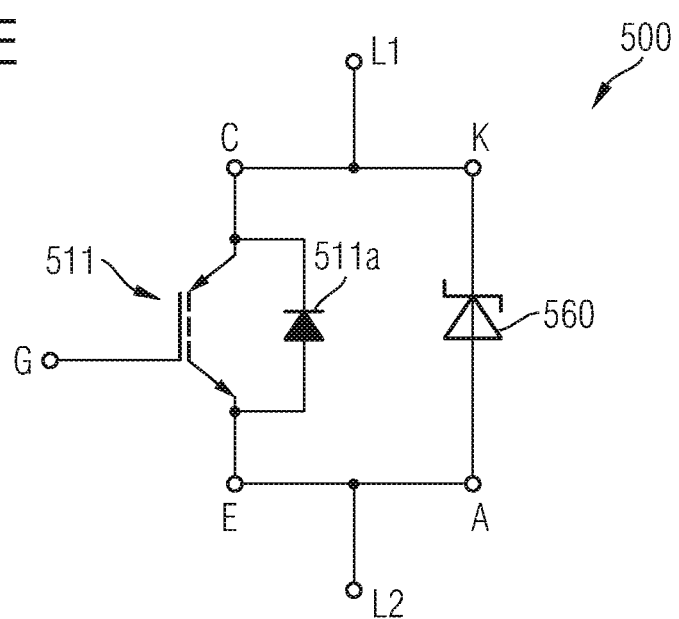
FIG. 3E is a schematic circuit diagram of an electric assembly according to an embodiment including a SiC clamping diode and an RC-IGBT (reverse conducting IGBT).

In FIG. 3E, the switching device 510 is an RC-IGBT 5 11 whose reverse conducting diode 511a may be effective as free-wheeling diode.

Figure 3F:
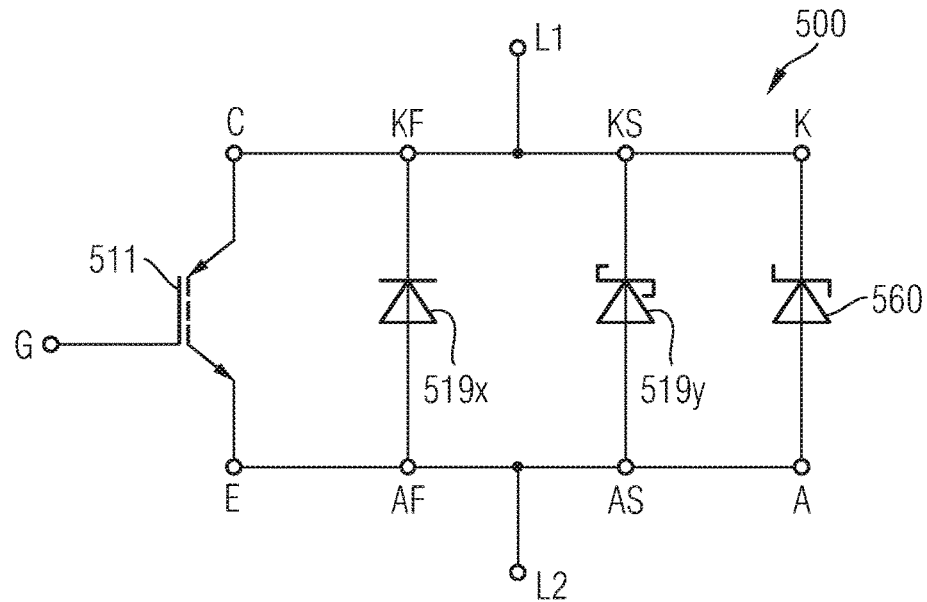
FIG. 3F is a schematic circuit diagram of an electric assembly according to an embodiment including a SI-IGBT, a Si-FWD, a SiC-SBD (silicon Schottky barrier diode), and a SiC clamping diode.

In FIG. 3F, the free-wheeling diode of FIG. 2B includes a Si-PND (silicon pn diode) 519x as well as a SiC-SBD (silicon carbide Schottky barrier diode) 519y. The Si-PND 519x typically suffers from a large recovery current resulting from charge carriers stored in the diode during the forward conduction mode and discharged when the Si-IGBT 511 turns on. The large recovery current results in high switching losses. On the other hand, the Si-SBD 519y is a unipolar device with very low recovery current. A too low recovery current, however, may result in sharp changes of the load current that in combination with capacitance and inductance components may induce noise in the load circuit. A free-wheeling diode including the Si-PND 519x and the SiC-SBD 519y allows for optimizing a trade-off between noise and recovery current. The trade-off can be adjusted by selecting a suitable area ratio between the Si-PND 519x and the SiC-SBD 519y for the forward conduction mode. The SiC-SBD 519a reduces recovery losses. By contrast, the clamping diode 560 protects the Si-IGBT 511, the SiC-SBD 519y and the Si-PND 519x against overvoltage.

In the blocking mode of the SiC-SBD 519y, the highest electric field is effective at the metal-to-semiconductor interface such that charge carriers directly pass into the semiconductor body 100 without generating electron/hole pairs The SiC-SBD 519y breaks down without that the avalanche phenomenon occurs. As a consequence the reverse current remains comparatively low and the SiC-SBD 519y cannot protect the Si-IGBT 511 against overvoltage even if the SiC-SBD 519y would have a lower breakdown voltage. Instead, in the clamping diode 560 the avalanche breakdown generates electron/hole pairs such that the reverse current is high and the clamping diode 560 effectively protects the Si-IGBT 511 against overvoltage.

Figure 3G:
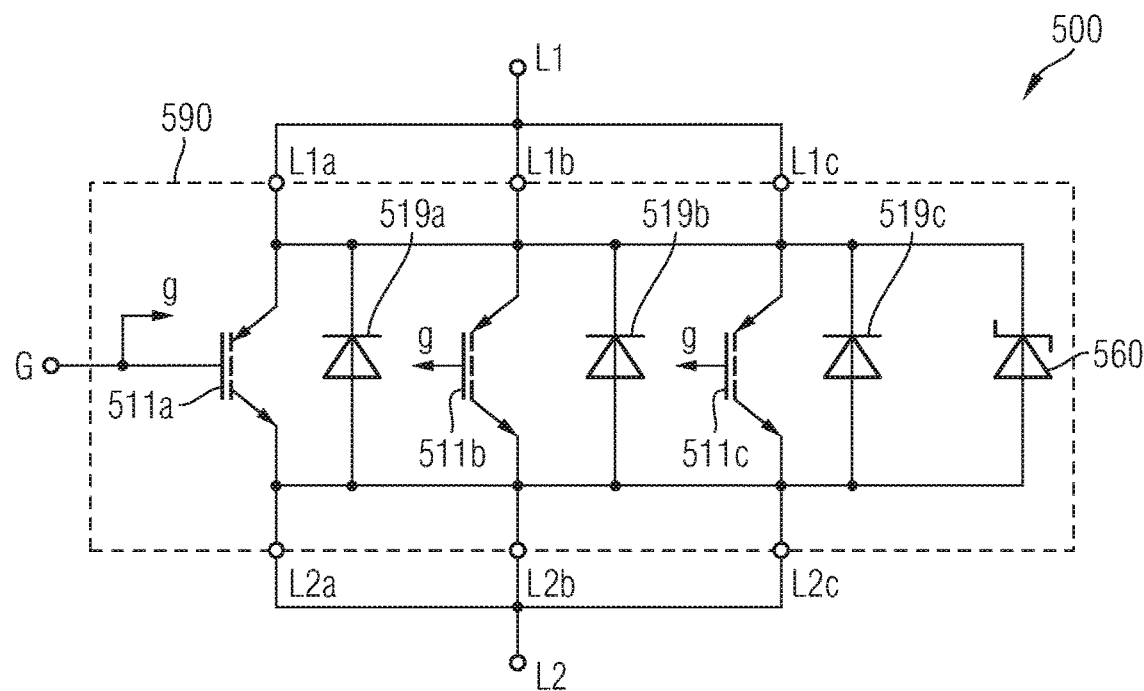
FIG. 3G is a schematic circuit diagram of an electric assembly according to an embodiment including a SiC clamping diode electrically connected in parallel to a plurality of semiconductor switching devices.

In FIG. 3G the electric assembly 500 includes a plurality of semiconductor switches electrically connected in parallel to each other, for example two, three or more Si-IGBTs 511a, 511b, 511c, . . . . To each Si-IGBT 511a, 511b, 511c, . . . a free-wheeling diode 519a, 519b, 519c, . . . may be electrically connected in parallel. One single clamping diode 560 may be electrically connected in parallel to the two, three or more Si-IGBTs 511a, 511b, 511c, . . . . The electric assembly 500 may be integrated in an IHM (IGBT high-power module) designed for load currents of 500 A to 4 kA. housing 590 may include first sets of load terminals L1a, L1b, L1c, . . . assigned to single Si-IGBTs 511a, 511b, 511c, . . . and seconds sets load terminals L2a, L2b, L2c, . . . assigned to single Si-IGBTs 511a, 511b, 511c, . . . . The electric assembly 500 may be the high-side portion or the low-side portion of a half-bridge circuit.

Figure 4A:
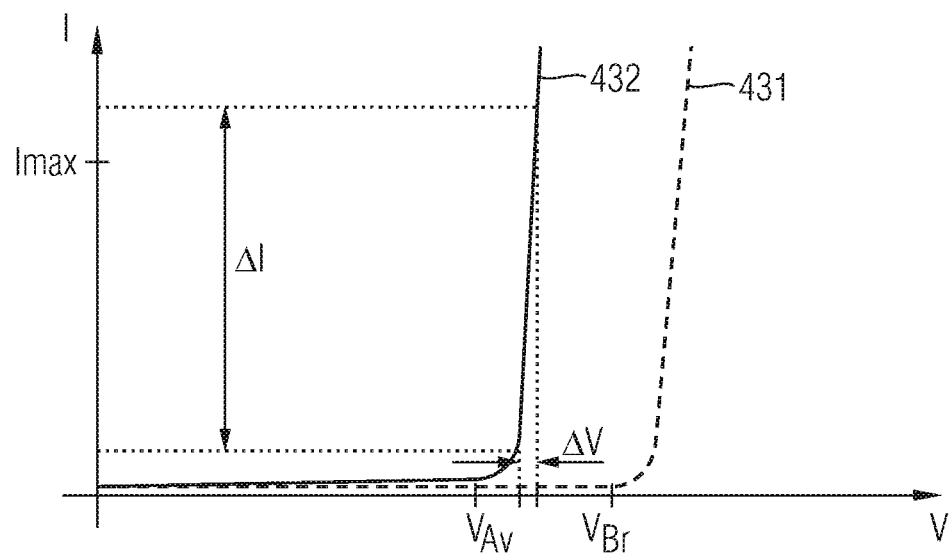
FIG. 4A is a schematic diagram showing voltage/current characteristics for a Si-IGBT and a SiC clamping diode of an electric assembly according to an embodiment.

In FIG. 4A an I/V characteristic 431 of an Si-IGBT shows a maximum breakdown voltage rating $V_{BR}$ and an I/V characteristic 432 of an SiC clamping diode of a switching assembly shows an avalanche voltage $V_{AV}$ that is at least 10% lower than $V_{BR}$ in a current range for which the Si-IGBT is intended to be used, e.g., for currents up to 20 A, 100 A or 200 A. In an approximately linear portion. of the I/V characteristic 432 of the SiC clamping diode through the maximum load current rating Imax, a ratio ΔV/ΔI is at most 2 V/A for an active diode area of 2.5 mm in a steep portion of the I/V characteristic, wherein the steep portion may be defined as the part of the I/V characteristic beyond a current density of 40 A/cm$^2$ or with a slope of a current density per Volt of at least 1 mA/mm$^2$/V.

Figure 4B:
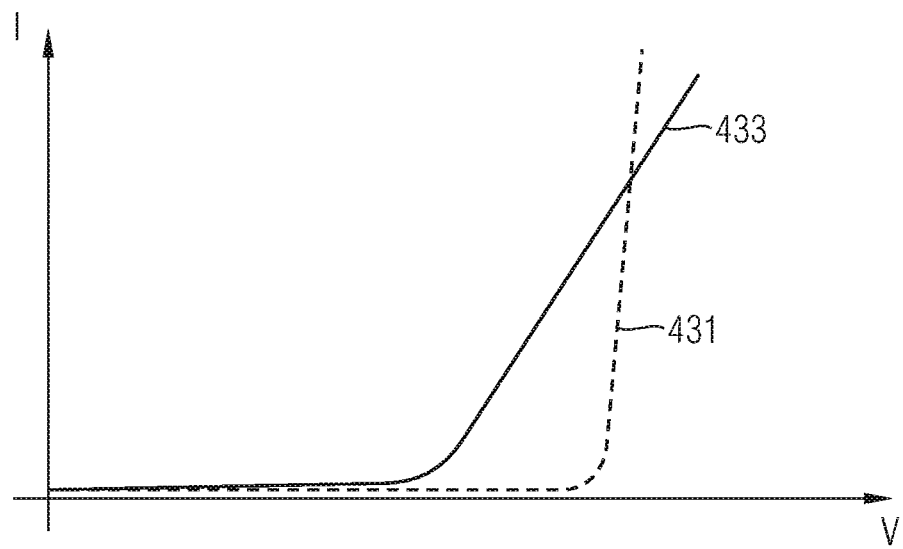
FIG. 4B is a schematic diagram showing voltage/current characteristics for a reference example including an Si-IGBT and an SiC-SBD (silicon carbide Schottky barrier diode) for discussing effects of the embodiments.

FIG. 4B shows the I/V characteristic 431 of the Si-IGBT of FIG. 4A and the I/V characteristic 433 of a SiC-SBD. The I/V characteristic 433 of the Si-SBD is significantly shallower than the I/V characteristic 432 of the clamping diode according to the present embodiments. Even when the Si-SBD starts to break down at a voltage similar to $V_{AV}$ of FIG. 4A, the voltage across the SiC-SBD may rise to above the breakdown voltage $V_{BR}$ of the Si-IGBT such that the SiC-SBD cannot protect the Si-IGBT safely from destruction by overvoltage events, because in the SiC-SBD breakdown occurs in a junction termination or the Schottky barrier breaks down.

The clamping diode 560 uses the avalanche breakdown to limit the voltage across the switching device 510. Typically, SiC diodes are designed to meet requirements concerning forward resistance and switching losses. If an avalanche breakdown occurs, it occurs in an edge region of a semiconductor body of the SiC diode such that the whole avalanche current flows only in a comparatively small portion of the semiconductor body. The semiconductor crystal can locally overheat and can be irreversibly damaged.

In FIG. 4C curve 431 shows the I/V characteristic of a silicon clamping diode at T=25 degree Celsius and curve 432 the I/V characteristic of the same diode at a maximum operating temperature. The silicon clamping diode can be used to protect a switching device with a maximum breakdown voltage rating VBRIGBT1.

FIG. 4D shows equivalent, curves 441, 442 for a SiC clamping diode at T=25 degree Celsius and at the maximum operating temperature. The lower shift of the I/V characteristic with increasing temperature results in that the switching device can be selected with lower maximum breakdown voltage rating VBRIGBT2 Typically, an IGBT with lower maximum breakdown voltage rating can be realized with lower conduction and switching losses.

FIG. 5A shows a clamping diode 560 configured to sustain repetitive avalanche breakdowns in typical applications for power conversion and motor driving.

A metal anode 310 directly adjoins to a first surface 101 at a front side of a semiconductor body 100. The metal anode 310 may include a Schottky barrier layer 311 of a first metal and a contact layer 312 of a second metal. The metal anode 310 forms or is electrically connected to an anode terminal A.

A cathode metal 320 directly adjoins to a second surface on the back opposite to the first surface 101. A lateral outer surface 103 tilted to the first and second surface 101, 102 connects the first and second first surfaces 101, 102. The metal cathode 320 forms or is electrically connected to a cathode terminal K and directly adjoins to a heavily n-doped cathode region 129 forming an ohmic contact with the metal cathode 320.

Between the first surface 101 and the cathode region 129 the semiconductor body 100 may include a lightly or medium n-doped drift zone 121 and field shaping structures 130. In case a reverse voltage is applied between the metal anode 310 and the metal cathode 320 the field shaping structures 130 shape the electric field such that the maximum electric field strength is in a region distant from the first surface 101. The semiconductor body 100 may also include heavily p-doped anode zones in ohmic contact with the metal anode 310.

In a central region 610 both the metal anode 310 and the metal cathode 320 directly adjoin to the semiconductor body 100 and the semiconductor body 100 is sandwiched between the metal anode 310 and the metal cathode 320. In the central region 610 a forward current $I_{Fwd}$ flows in a vertical direction through the semiconductor body 100. In a termination region 690 separating the central region 610 from the outer surface 103 an interlayer dielectric 210 separates the metal anode 310 from the semiconductor body 100. In the termination region 690 a forward current vector has a component horizontal to the first surface 101 and no charge carriers pass through the first surface 101.

The clamping diode 560 according to the embodiments clamps the avalanche breakdown within the central region 610. Since the central region 610 is comparatively homogeneous, the avalanche current can quickly spread across the whole central region 610. Local overheating can be avoided and the clamping diode 560 shows sufficient avalanche ruggedness against repetitive, periodic avalanche breakdowns.

When in SiC-SBDs the blocking voltage is high enough such that the electric field in the semiconductor body 100 overlaps with the metal-to-semiconductor interface the electric field supports the transition of charge carriers from the metal anode 310 into the semiconductor body 100. In typical Schottky diodes, the maximum electric field strength is at the metal-to-semiconductor interface at the anode side. Therefore SiC-SBDs suffer from a comparatively high leakage current. Instead, in the semiconductor bodies 100 of the clamping diodes 560 of the present embodiments the field shaping structures 130 shape the electric field such that the maximum electric field strength occurs at a distance to the metal anode 310.

Figure 5B:
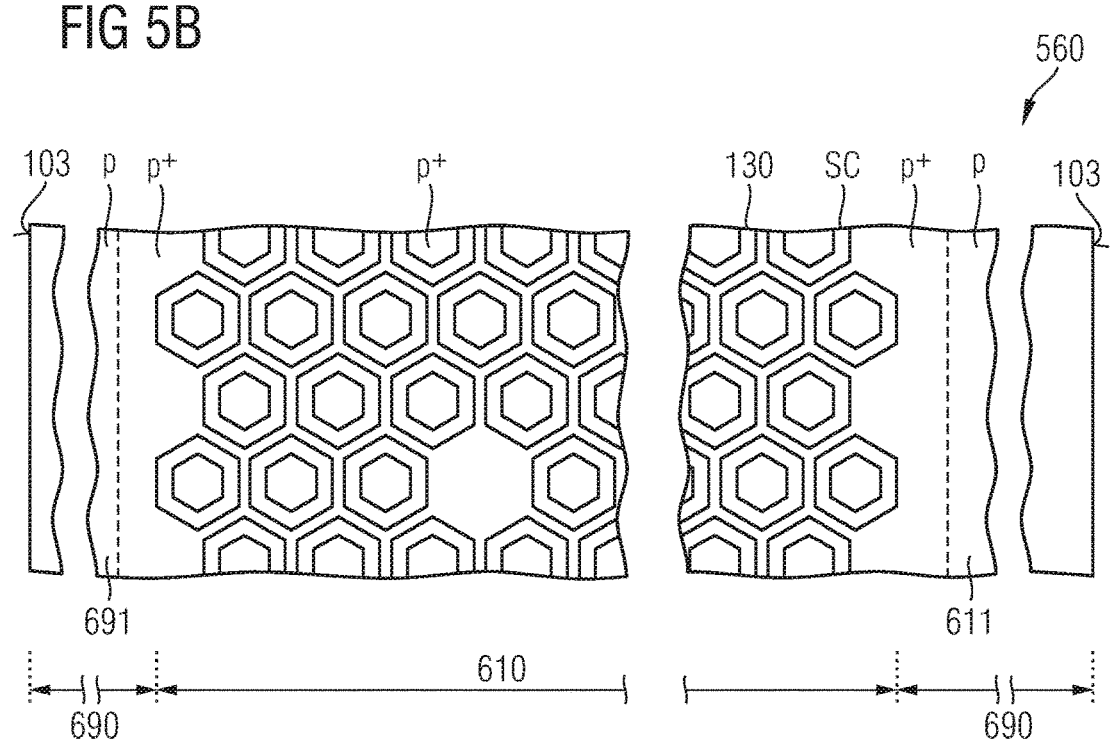
FIG. 5B is a schematic horizontal cross-sectional view of an SiC clamping diode according to an embodiment, wherein an avalanche breakdown takes place in a central region of the SiC clamping diode.

FIG. 5B shows Schottky contacts SC forming regularly arranged, separated hexagonal frames in the central region 610. Anode zones of MPS diodes or other field shaping structures 130 may be formed between and/or within the hexagonal frames. A termination region 690 is devoid of Schottky contacts SC and may include a JTE (junction termination extension) 691. For clamping diodes with anode zones the JTE 691 may include one or more zones with lower net dopant concentration as the anode zones. The maximum electric field strength occurs in the central region 610.

Figure 6A:
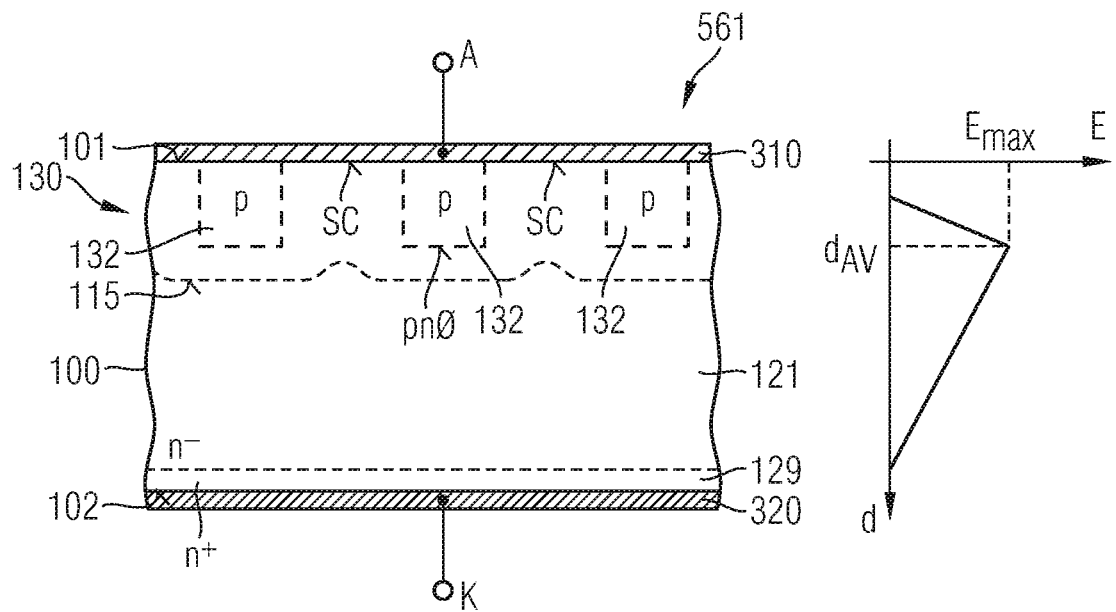
FIG. 6A is a schematic vertical cross-sectional view of a portion of an SiC clamping diode with pn junction according to an embodiment based on an MPS (merged pin Schottky) diode.
Figure 6B:
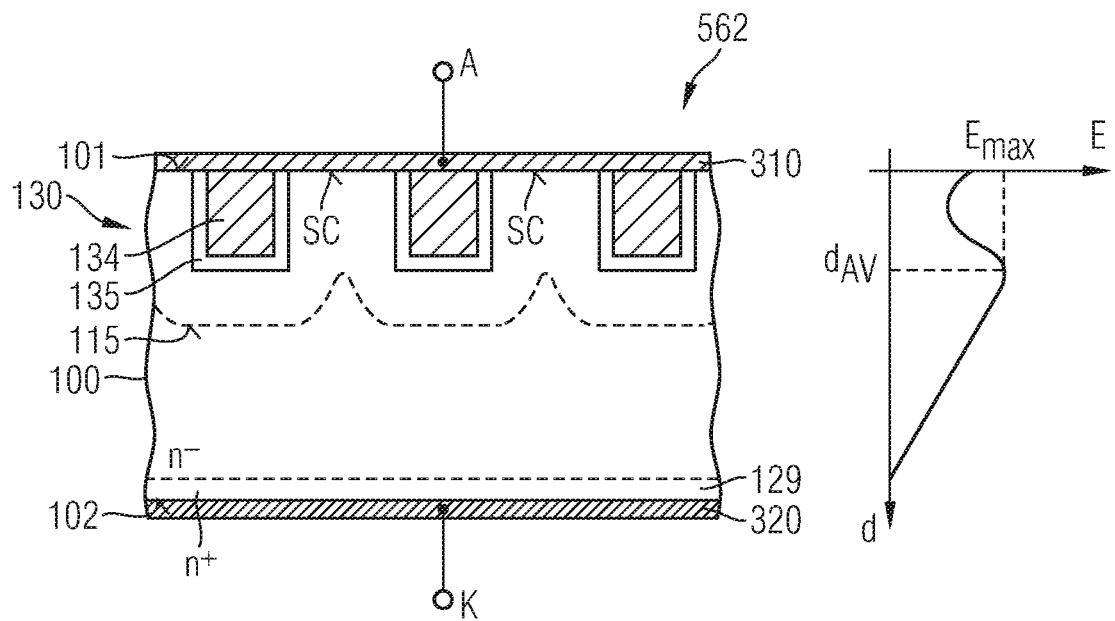
FIG. 6B is a schematic vertical cross-sectional view of a portion of an SiC clamping diode without pn junction according to an embodiment based on a TMPS (trench MOS barrier Schottky) diode.
Figure 6C:
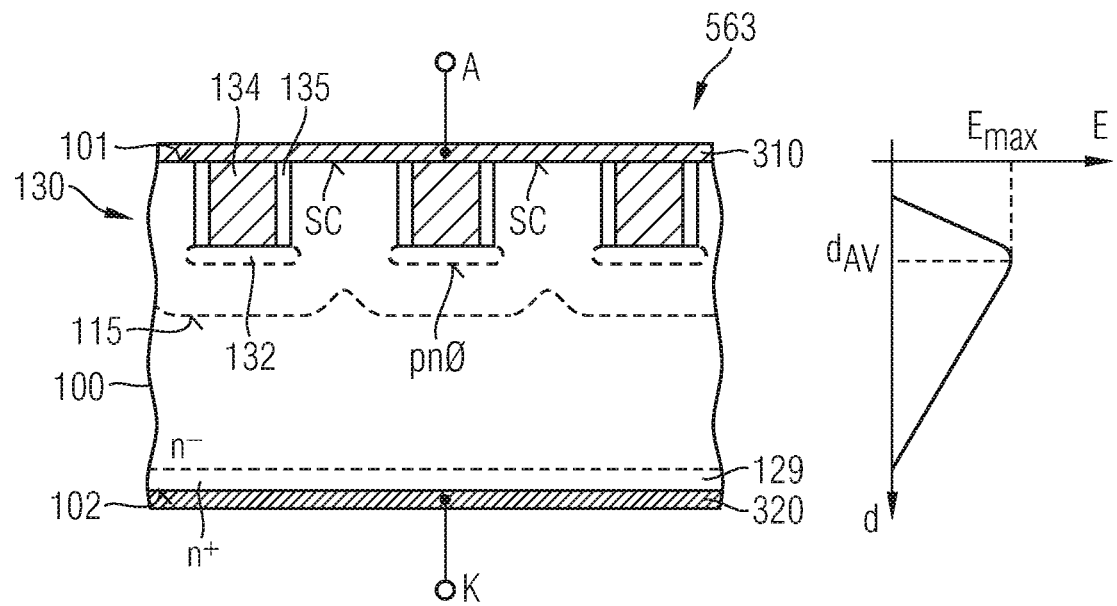
FIG. 6C is a schematic vertical cross-sectional view of a portion of a clamping diode with pn junction according to an embodiment based on a TOPS (trench oxide pin Schottky) diode.

The embodiments of FIGS. 6A to 6C refer to field shaping structures 130 that shape the electric field in a way that the maximum electric field strength is at a distance to the metal anode 310.

FIG. 6A shows the central region of an MPS diode 561. The field shaping structures 130 are isolated anode zones 132 extending from the first surface 101 into the drift zone 121. The anode zones 132 form pn junctions pn0 with the drift zone 121. The anode zones 132 may be stripe-shaped with one horizontal dimension significantly exceeding the second horizontal dimension orthogonal to the first horizontal dimension, may be rather dot-shaped with both horizontal dimensions within the same order of magnitude or may form a hexagonal grid. Between neighboring anode zones 132 portions of the drift zone 121 directly adjoin to a metal anode 310 and form Schottky contacts SC with the metal anode 310.

In the forward biased mode, the Schottky contacts SC provide a unipolar forward current resulting in low reverse-recovery charge. In the reverse biased mode, vertical pn junctions between the drift zone 121 and the anode zones 132 pinch-off the Schottky contacts SC as indicated by the shape of the depletion region 115. As a consequence, the maxim field strength $E_{max}$ appears at a distance $d_{AV}$ to the first surface 101. With increasing blocking voltage, the maximum electric field strength $E_{max}$ approximates the avalanche field strength and avalanche breakdown starts in the semiconductor body 100 at a distance to the first surface 101.

In FIG. 6B the field shaping structures 130 of a TMBS diode 562 include polycrystalline silicon plugs 134 extending from the first surface 101 into the semiconductor body 100. Horizontal cross-sections of the polysilicon plugs 134 may be dot-shaped, stripe-shaped or form a grid. An insulator layer 135 completely insulates the polysilicon plugs 134 from the semiconductor body 100. Schottky contacts SC are formed between neighboring polysilicon plugs 134.

When the TMBS diode 562 is reverse biased, the anode potential of the polysilicon plugs 134 depletes adjoining portions of the drift zone 121. With increasing reverse bias depletion regions of neighboring plugs 134 overlap. The resulting depletion region 115 pinches off the Schottky contacts SC and suppresses a leakage current induced at the Schottky contacts SC. The electric field strength has a maximum $E_{max}$ at a distance $d_{AV}$ to the first surface 101.

FIG. 6C refers to a TOPS diode 563 with field shaping structures 130 including conductive plugs 134 extending from the first surface 101 into the drift zone 121. Insulator structures 135 line vertical sidewalls of the conductive plugs 134. In the vertical projection of the conductive plugs 134 separated heavily p-doped anode zones 132 form pn junctions pn0 with a drift zone 121. The insulator structures 135 prevent the diffusion of p-type dopants in a lateral direction and support the formation of the anode zones 132 in a distance to the first surface 101. Schottky contacts SC are formed between neighboring polysilicon plugs 134. The maximum electric field strength $E_{max}$ occurs at a distance $d_{AV}$ to the first surface 101.

Figure 6D:
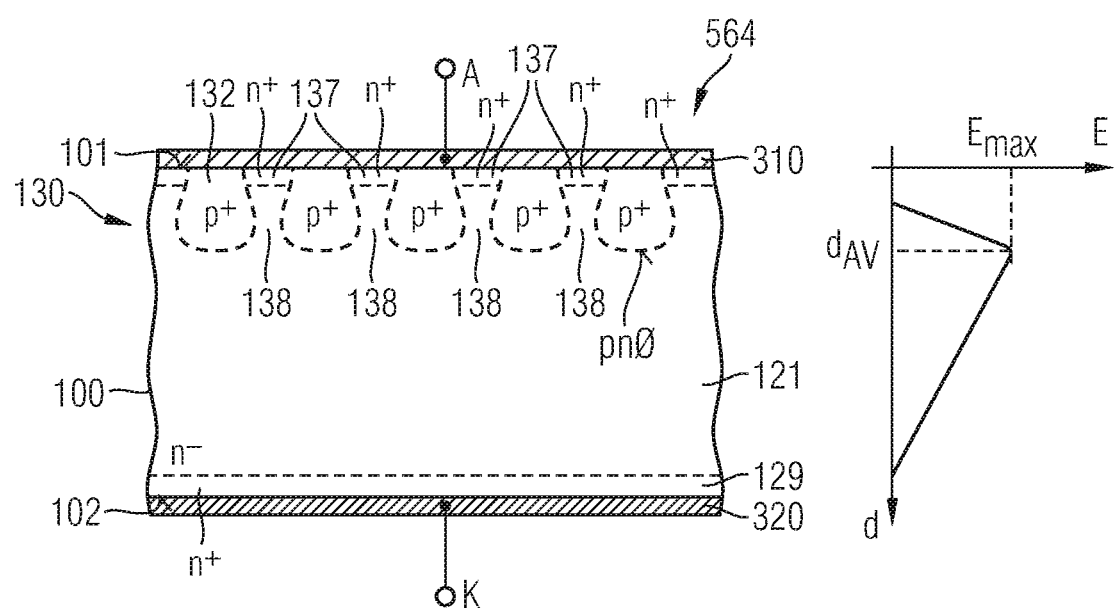
FIG. 6D is a schematic vertical cross-sectional view of a portion of a clamping diode according to an embodiment based on an IDEE (inverse injection dependency of emitter efficiency) diode.

In FIG. 6D a semiconductor body 100 of a SiC IDEE diode 564 used as clamping diode includes anode zones 132 and oppositely doped channels 138 between the anode zones 132. Heavily doped channel contact zones 137 of the conductivity type of the channels 138 form ohmic contacts with the metal anode 310. Dopant concentrations and dimensions of the anode zones 132 and the channels 138 areselected such that an electric field fully depletes the channels 138 from mobile charge carriers in a reverse-biased state of the clamping diode 50.

Figure 6E:
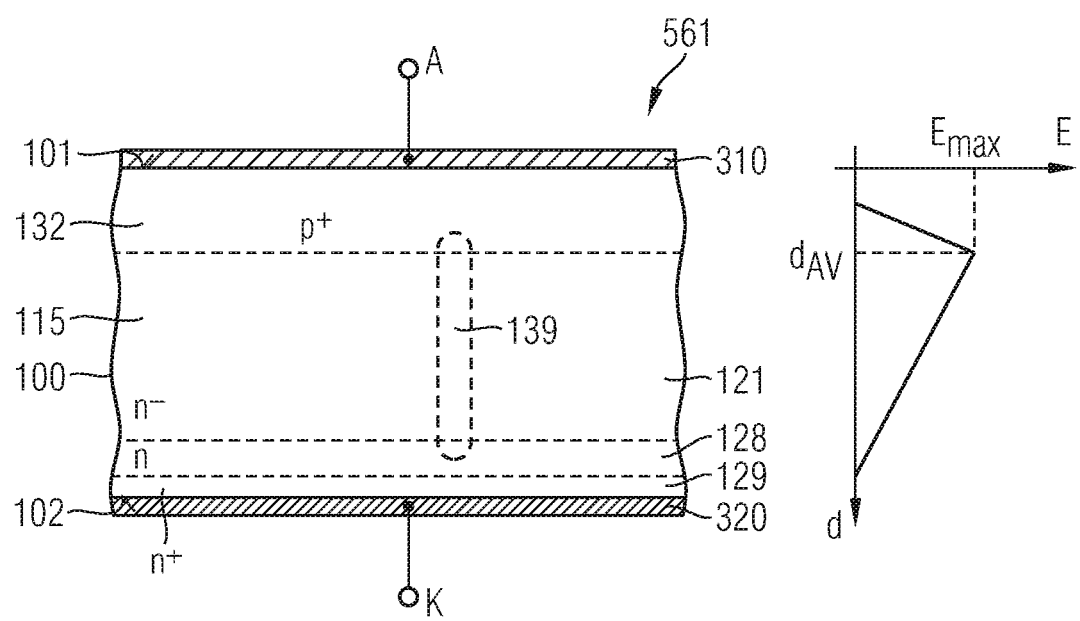
FIG. 6E is a schematic vertical cross-sectional view of a portion of a clamping diode according to an embodiment based on an SiC pin diode with avalanche breakdown pinned in a device region that, apart from pinning regions, is laterally homogeneous.

In FIG. 6E a semiconductor body 100 of a SiC pin diode 565 used as clamping diode 560 includes an anode zone 132 forming a pn junction pn0 with a Lightly n-doped drift zone 121. An n-doped field stop layer 128 with a net dopant concentration exceeding at least 5 times a mean net dopant concentration in the drift zone 121 may be sandwiched between the drift zone 121 and the cathode region 129. The lateral extension of the anode zone 132 defines a device region. Within the device region the anode zone 132, the field stop zone 128 and the drift zone 121 are laterally homogenous outside of one or more pinning regions 139. Within the pinning region 139, the avalanche breakdown voltage is locally decreased. For example, in the pinning region 139, the anode zone 132 may include a more heavily doped portion, the drift zone 121 may include a more heavily doped portion and/or a vertical extension of the field stop layer 128 may be varied. An avalanche breakdown starts in the pinning region 139 and spreads into the device region. For example, in the pinning region 139, the field stop layer 128 and/or the anode zone 132 may locally extend deeper into the drift zone 121 than outside of the pinning region 139.

Figure 7:
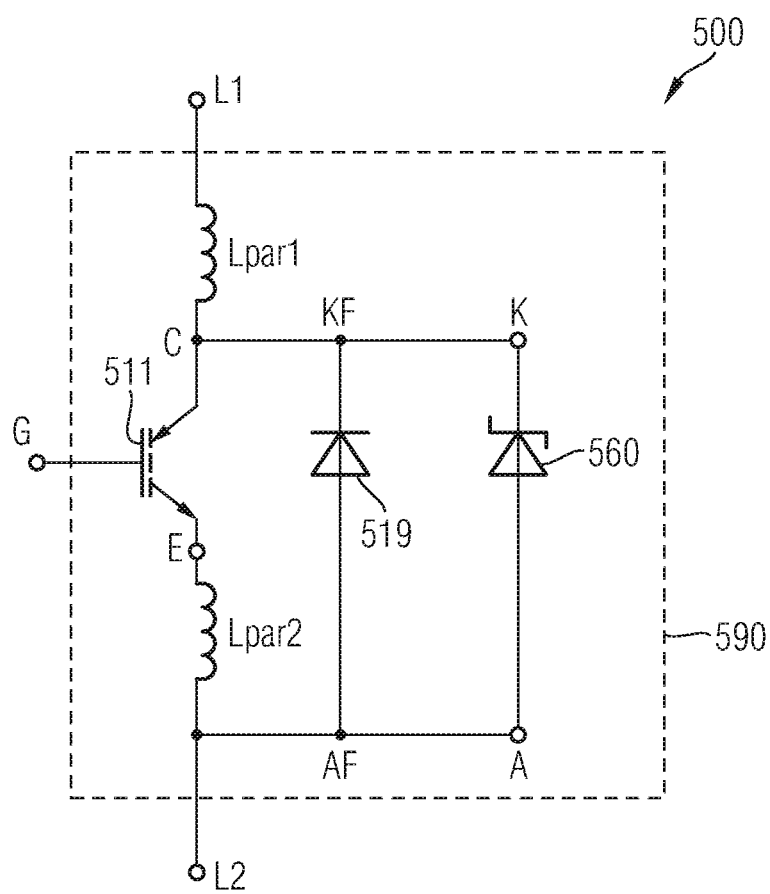
FIG. 7 is a schematic circuit diagram of an electric assembly with parasitic inductances for discussing effects of the embodiments.

FIG. 7 refers to an electric assembly 500 including a component carrier 590, which may be a PCB. A clamping diode 560 is arranged as close as possible to a Si-IGBT 511 such that a parasitic inductance effective between the clamping diode 560 and the Si-IGBT 511 and a free-wheeling diode 519 is as low as possible. For example, the cathode K of the clamping diode 560, the cathode KF of the free-wheeling diode 519 and the collector C of the Si-IGBT 511 are directly connected through a conductive plate such that approximately no inductance is effective between the cathode K of the clamping diode 560 and the collector C of the Si-IGBT 511. Conductors on a board may electrically connect the collector electrode C of the Si-IGBT 511 with the first load terminal L1 and form a first parasitic inductance Lpar1. Bond wires may electrically connect the emitter electrode E of the Si-IGBT 511 with the second load terminal L2 and may form a second parasitic inductance Lpar2.

Figure 8A:
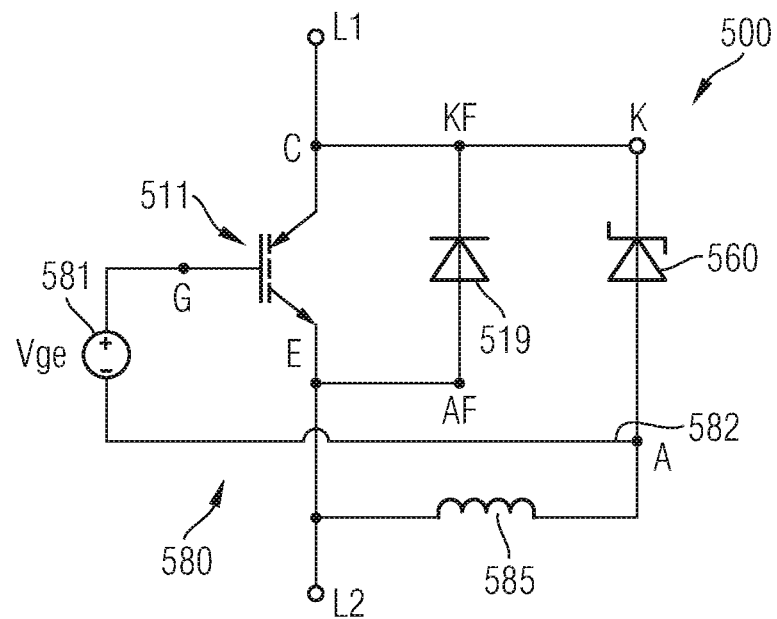
FIG. 8A is a schematic circuit diagram of an electric assembly according to an embodiment including a feedback path using a voltage drop across an inductivity.
Figure 8B:
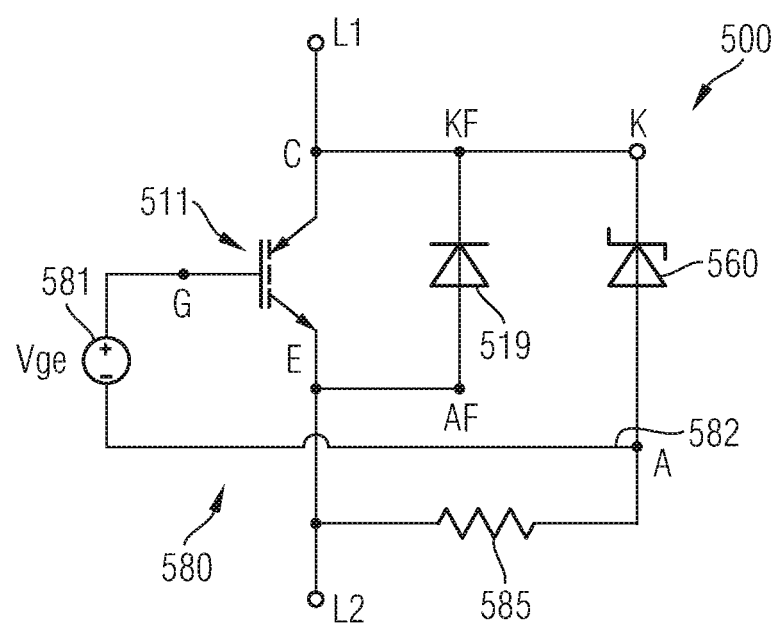
FIG. 8B is a schematic circuit diagram of an electric assembly according to an embodiment including a feedback path using a voltage drop across an ohmic resistance.

A voltage drop across a bond wire or another connector between the anode terminal A of the clamping diode 560 and the second load terminal L2 may be used for a feedback circuit 580 as illustrated in FIGS. 8A and 8B.

In FIGS. 8A and 8B an electric assembly 500 includes a semiconductor switching device, e.g., Si-IGBT 511 that withstands a maximum breakdown voltage rating across two load terminals L1, L2 in an off-state. A clamping diode 560 is electrically connected to the two load terminals L1, L2 and parallel to the switching device. An avalanche voltage of the clamping diode 560 is lower than the maximum breakdown voltage rating of the switching device. A free-wheeling diode 519 may be electrically connected in parallel to the clamping diode 560.

For example, a semiconductor body of the clamping diode 560 is of crystalline silicon and may include anode zones and oppositely doped channels between the anode zones. Dopant concentrations and dimensions of the anode zones and the channels are selected such that the channels are fully depleted from mobile charge carriers in a reverse-biased state of the clamping diode 560. According to another embodiment, the clamping diode 560 is any of the above discussed SiC diodes.

If in FIG. 8A the clamping diode 560 becomes conductive in avalanche breakdown, the increasing current across a bond wire or a conductive path may be used to increase the potential at the gate electrode G of the Si-IGBT 511. The Si-IGBT 511 may become partly conductive such that a portion of the power supplied from the overvoltage is dissipated in the Si-IGBT 511.

To this purpose, a feedback path 582 connects an anode electrode A of the clamping diode 560 with a control element 581 electrically connected to the gate electrode G of the Si-IGBT 511. The control element 581 receives a potential across a feedback impedance 585 connected between the anode electrode A and the second load terminal L2, wherein the control element 581 may consider the inductance of the feedback impedance 585, the resistance or both. The control element 581 may be a voltage-controlled voltage, a current source, or a gate driver circuit which can be controlled by a signal applied to a control input. The feedback impedance 585 may be a bond wire, a conductive path on a board, a separate element, or any combination thereof. Since a portion of the clamping current is dissipated in the Si-IGBT 511, the clamping diode 560 has to convey a lower avalanche current and can have a smaller outline than without the feedback circuit 580.

In FIG. 8B the control element 581 receives and evaluates a potential across an ohmic feedback impedance 585.

Figure 9A:
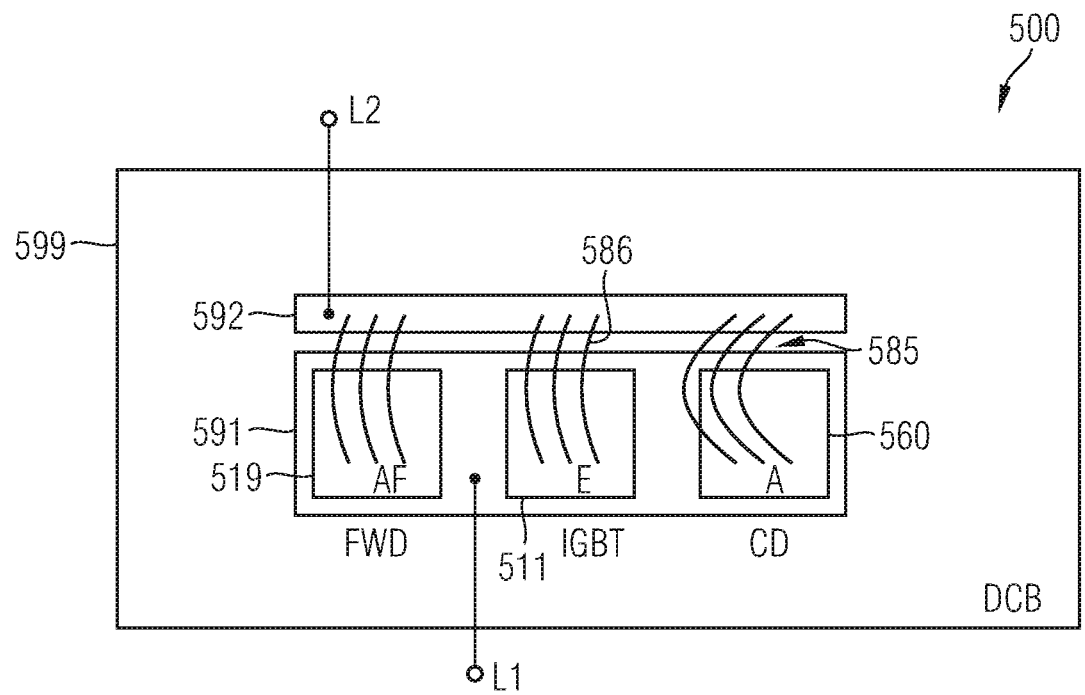
FIG. 9A is a schematic plan view of a direct copper bonded board with an electric assembly according to an embodiment with a feedback path including bonding wires.
Figure 9B:
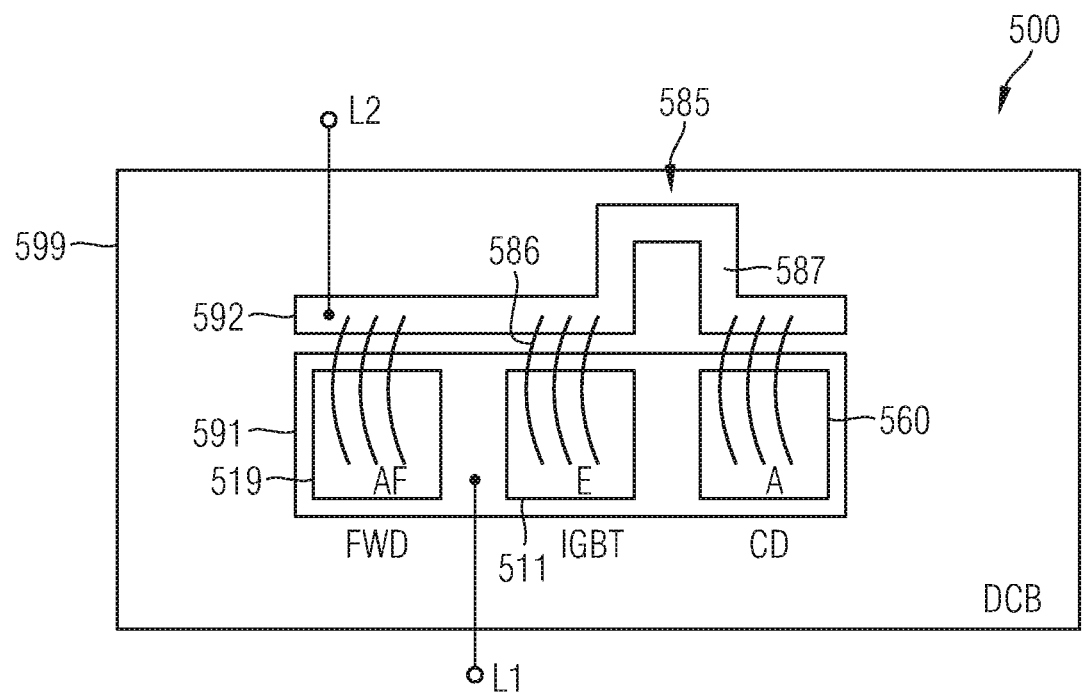
FIG. 9B is a schematic plan view of a direct copper bonded board with an electric assembly according to another embodiment with a feedback path including a strip conductor forming a loop.

In FIGS. 9A and 9B electric assemblies 500 include a carrier board 599, e.g., a PCB (printed circuit board) or DCB (directly copper bonding) board. At least a first conductor structure 591 and a second conductor structure 592 are formed on a mounting surface of the carrier board 599. The first conductor structure 591 forms or is electrically connected to a first load terminal L1. The second conductor structure 592 forms or is electrically connected to a second load terminal L2. The first and second conductor structures 591, 592 may be copper pads or copper strips.

An Si-IGBT 511, a free-wheeling diode 519 and a clamping diode 560 are mounted, e.g., soldered or bonded side-by-side on the first conductor structure 591, wherein the cathodes of the free-wheeling diode 519 and the clamping diode 560 as well as the collector of the Si-IGBT 511 directly contact the first conductor structure 591. Bond wirings 586 electrically connect the exposed anode terminal AF of the free-wheeling diode 519 and the exposed anode terminal A of the clamping diode 560 with the second conductor structure 592.

In FIG. 9A the bond wiring 586 between the clamping diode 560 and the second conductor structure 592 forms part of the feedback impedance 585 of FIG. 8A. The feedback impedance may be increased by reducing the number of bond wires in the bond wiring 586 between the clamping diode 560 and the second conductor structure 592, or by lengthening the bond wires.

In FIG. 9B a loop 587 in the second conductor structure 592 between the Si-IGBT 511 and the clamping diode 560 may increase the feedback impedance 585.

Figure 10:
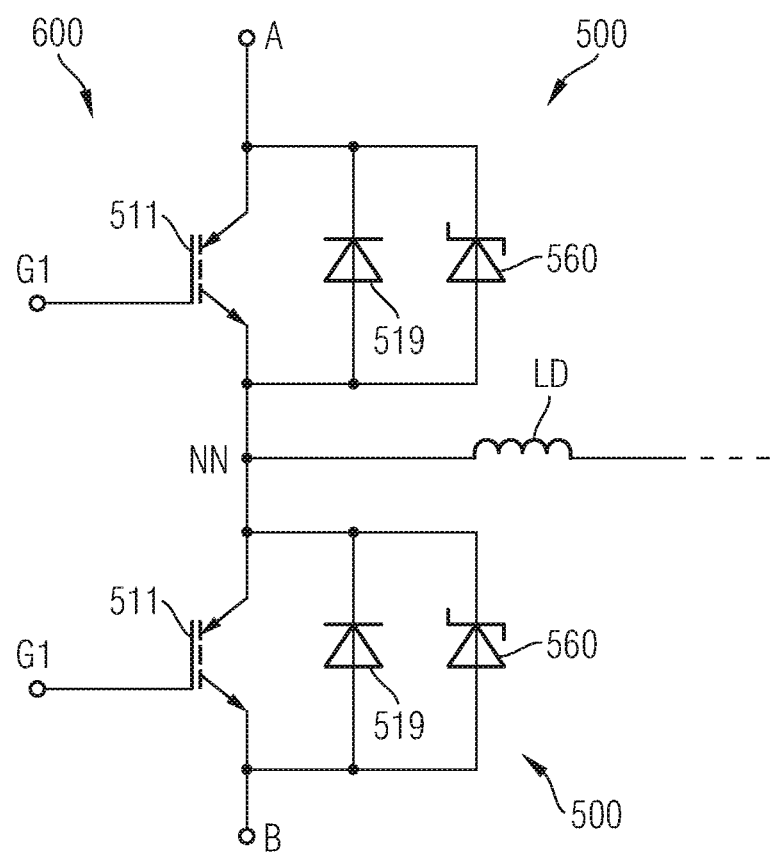
FIG. 10 is a schematic diagram of a half bridge circuit including SiC clamping diodes parallel to semiconductor switching devices according to a further embodiment.

FIG. 10 refers to a portion of an electronic assembly 600 that may be a motor drive, a switched mode power supply, a primary stage of a switched mode power supply, a synchronous rectifier, a primary stage of a DC-to-AC converter, a secondary stage of a DC-to-AC converter, a primary stage of a DC-to-DC converter, or a portion of a solar power converter, by way of example.

The electronic assembly 600 may include two identical electric assemblies 500 as described above arranged as low-side switch and high-side switch in a half-bridge configuration. The electric assemblies 500 may include IGBTs 511 with parallel clamping diodes 560 and the load paths of the two electric assemblies 500 are electrically connected in series between a first supply terminal A and a second supply terminal B. The supply terminals A, B may supply a DC (direct-current) voltage or an AC (alternating-current) voltage. An intermediate network node NN between the two electric assemblies 500 may be electrically connected to an inductive load LD, which may be a winding of a transformer or a motor winding, or to a reference potential of an electronic circuit, by way of example.

The electronic assembly 600 may be a motor drive with the electric assemblies 500 electrically arranged in a half-bridge configuration, the network node NN electrically connected to a motor winding and the supply terminals A, B supplying a DC voltage.

According to another embodiment, the electronic assembly 600 may be a primary side stage of a switched mode power supply with the supply terminals A, B supplying an AC voltage of an input frequency to the electronic assembly 600. The network node NN is electrically connected to a primary winding of a transformer.

The electronic assembly 600 may be a synchronous rectifier of a switched mode power supply with the supply terminals A, B connected to a secondary winding of the transformer and the network node NN electrically connected to a reference potential of an electronic circuit at the secondary side of the switched mode power supply.

According to a further embodiment, the electronic assembly 600 may be a primary side stage of a DC-to-DC converter, e.g., a power optimizer or a micro-inverter for applications including photovoltaic cells with the supply terminals A, B supplying a DC voltage to the electronic assembly 600 and the network node NN electrically connected to an inductive storage element.

According to another embodiment, the electronic assembly 600 may be a secondary side stage of a DC-to-DC converter, e.g., a power optimizer or a micro-inverter for applications including photovoltaic cells, wherein the electronic assembly 600 supplies an output voltage to the supply terminals A, B and wherein the network node NN is electrically connected to the inductive storage element.

Figure 11:
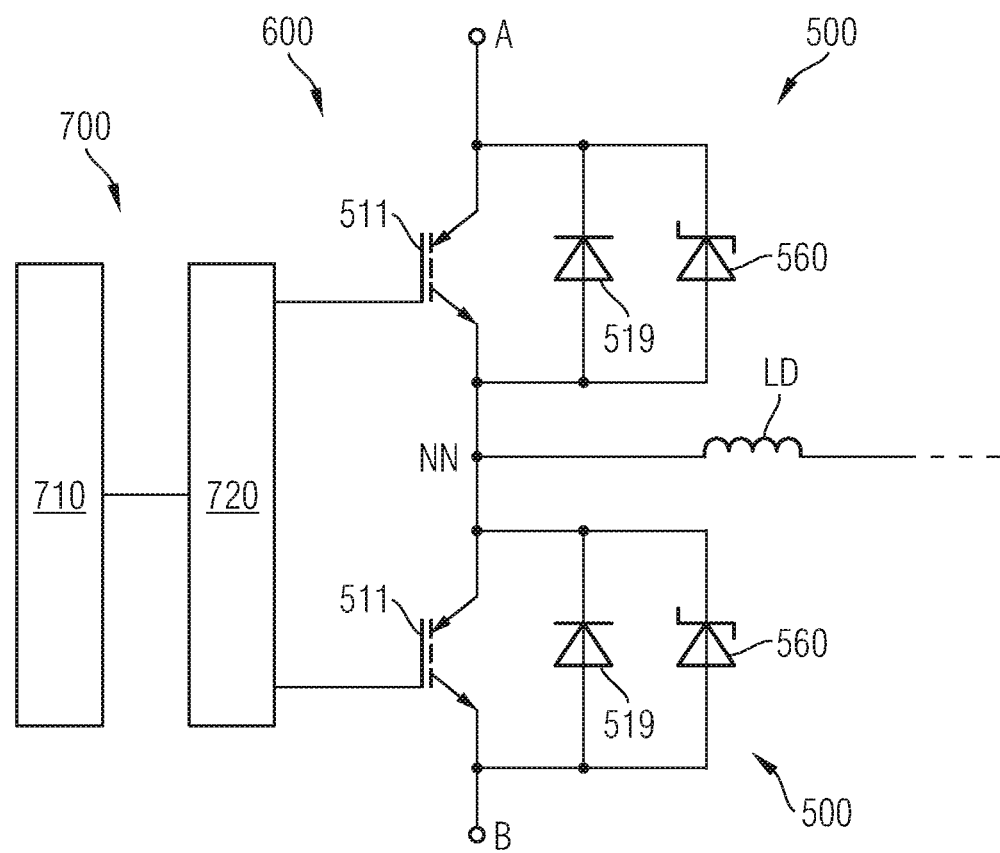
FIG. 11 is a schematic diagram of a smart IGBT module including SiC clamping diodes parallel to semiconductor switching devices according to a further embodiment.

FIG. 11 refers to an IGBT module 700 including the electronic assembly 600 of FIG. 9. The IGBT module 700 may further include a control circuit 710 configured to supply a control signal for alternately switching on and off the electronic assembly 600 and a gate driver 720 controlled by the control circuit 710 and electrically connected to gate terminals of the electronic assembly 600.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electric assembly, comprising:
a semiconductor switching device configured to withstand a maximum breakdown voltage rating across two load terminals in an off-state; and
a clamping diode electrically connected to the two load terminals and parallel to the switching device, wherein a semiconductor body of the clamping diode comprises silicon carbide and an avalanche voltage of the clamping diode is lower than the maximum breakdown voltage rating of the switching device.

2. The electric assembly of claim 1, wherein the clamping diode is configured to sustain at least 400% of a maximum long-term load current rating of the switching device for at least 10 ns.

3. The electric assembly of claim 1, wherein the clamping diode comprises a pn junction effective between a. metal anode and a metal cathode.

4. The electric assembly of claim 1, wherein the clamping diode comprises field shaping structures configured such that in a blocking mode of the clamping diode an electric field strength has a maximum value in a distance to a metal-semiconductor interface between the semiconductor body and a metal anode of the clamping diode.

5. The electric assembly of claim 4, wherein the clamping diode comprises a Schottky contact between the semiconductor body and the metal anode.

6. The electric assembly of claim 1, wherein the clamping diode comprises a central region in a vertical projection of both a metal anode and a metal cathode as well as a termination region surrounding the central region, and wherein a breakdown voltage in the central region is lower than a breakdown voltage in the termination region.

7. The electric assembly of claim 1, wherein the clamping diode is a merged pin Schottky (MPS) diode.

8. The electric assembly of claim 1, wherein the clamping diode is a trench MOS barrier Schottky diode.

9. The electric assembly of claim 1, wherein the clamping diode is a trench oxide pin diode (TOPS) diode.

10. The electric assembly of claim 1, wherein the clamping diode is an inverse-injection-dependency-of-emitter-efficiency (IDEE) diode.

11. The electric assembly of claim 1, wherein the clamping diode is a SiC pin diode.

12. The electric assembly of claim 1, further comprising:
a free-wheeling diode connected between the two load terminals in parallel to the switching device and to the clamping diode, wherein an avalanche voltage of the clamping diode is lower than a breakdown voltage of the free-wheeling diode.

13. The electric assembly of claim 12, wherein the free-wheeling diode comprises a silicon pin diode.

14. The electric assembly of claim 12, wherein the free-wheeling diode comprises a silicon carbide Schottky diode.

15. The electric assembly of claim 1, further comprising:
at least one further semiconductor switching device electrically arranged in parallel to the switching device.

16. The electric assembly of claim 1, wherein the switching device comprises a silicon insulated gate bipolar transistor (Si-IGBT).

17. The electric assembly of claim 1, further comprising:
a feedback circuit electrically connecting an anode electrode of the clamping diode with a gate electrode of the switching device,
wherein the feedback circuit is configured to increases a gate voltage at the gate electrode with increasing current through the reverse-biased clamping diode.

18. The electric assembly of claim 17, further comprising:
a feedback impedance electrically connected between the anode electrode of the clamping diode and the second load terminal,
wherein the feedback circuit comprises a feedback path electrically connecting the anode electrode of the clamping diode with a control element electrically connected to the gate electrode of the switching device,
wherein the control element is configured to increase a gate voltage at the gate electrode with increasing current through the reverse-biased clamping diode.

19. The electric assembly of claim 18, wherein the control element is selected from the group consisting of a voltage-controllable voltage, a current source and a gate driver circuit.

20. The electric assembly of claim 1, wherein the avalanche voltage of the clamping diode is lower than the maximum breakdown voltage rating of the switching device for a total nominal temperature range and for a maximum current rating of the switching device.

21. The electric assembly of claim 1, wherein the avalanche voltage of the amping diode is at least 300V.

22. An electronic assembly, comprising:
a low-side switch comprising a first electric assembly and a high-side switch comprising a second electric assembly, the low-side switch and the high-side switch electrically arranged in a half-bridge configuration,
wherein at least one of the electric assemblies comprises:
a semiconductor switching device configured to withstand a maximum breakdown voltage rating across two load terminals in an off-state; and
a clamping diode electrically connected to the two load terminals and parallel to the switching device, wherein a semiconductor body of the clamping diode comprises silicon carbide and an avalanche voltage of the clamping diode is lower than the maximum breakdown voltage rating of the switching device for a nominal temperature range of the switching device.

23. An insulated gate bipolar transistor module, comprising:
a half-bridge circuit, comprising a low-side switch comprising a first electric assembly and a high-side switch comprising a second electric assembly,
wherein at least one of the electric assemblies comprises:
a semiconductor switching device configured to withstand a maximum breakdown voltage rating across two load terminals in an off-state; and
a clamping diode electrically connected to the two load terminals and parallel to the switching device, wherein a semiconductor body of the clamping diode comprises silicon carbide and an avalanche voltage of the clamping diode is lower than the maximum breakdown voltage rating of the switching device for a nominal temperature range of the switching device.

24. The insulated gate bipolar transistor module of claim 23, further comprising:
a gate driver electrically connected to gate terminals of the electric assemblies.

25. An electric assembly, comprising:
a semiconductor switching device configured to withstand a maximum breakdown voltage rating across two load terminals in an off-state;
a clamping diode electrically connected to the two load terminals and parallel to the switching device, wherein an avalanche voltage of the clamping diode is lower than the maximum breakdown voltage rating of the switching device; and
a feedback circuit electrically connecting an anode electrode of the clamping diode with a gate electrode of the switching device,
wherein the feedback circuit is configured to increase or decrease a gate voltage at the gate electrode with increasing current through the reverse-biased clamping diode.

26. The electric assembly of claim 25, wherein a semiconductor body of the clamping diode comprises silicon carbide.

* * * * *

UNITED STATES PATENT AND TRADEMARK OFFICE
CERTIFICATE OF CORRECTION

Page 1 of 1

PATENT NO. : 10,333,387 B2
APPLICATION NO. : 15/331548
DATED : June 25, 2019
INVENTOR(S) : Basler et al.

It is certified that error appears in the above-identified patent and that said Letters Patent is hereby corrected as shown below:

On the Title Page

Item (73), change "Techonologies" to -- Technologies --.

In the Claims

Column 16, Line 57 (Claim 3, Line 2), change "a. metal" to -- a metal --.
Column 17, Line 14 (Claim 10, Line 2), change "iniection" to -- injection --.

Signed and Sealed this
Tenth Day of September, 2019

Andrei Iancu
*Director of the United States Patent and Trademark Office*